(12) United States Patent
Tomotani

(10) Patent No.: US 6,452,862 B1
(45) Date of Patent: Sep. 17, 2002

(54) SEMICONDUCTOR MEMORY DEVICE HAVING HIERARCHICAL WORD LINE STRUCTURE

(75) Inventor: Hiroshi Tomotani, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/981,981

(22) Filed: Oct. 19, 2001

(30) Foreign Application Priority Data

Oct. 23, 2000 (JP) ........................................ 2000-322131

(51) Int. Cl.7 .................................................. G11C 8/00
(52) U.S. Cl. .................................. 365/230.06; 365/203
(58) Field of Search ...................... 365/230.03, 230.06, 365/203, 51, 63

(56) References Cited

U.S. PATENT DOCUMENTS

| | | | |
|---|---|---|---|
| 5,587,959 A | * 12/1996 | Tsukude ................ | 365/230.03 |
| 5,761,149 A | * 6/1998 | Suzuki et al. .......... | 365/230.06 |
| 5,862,098 A | * 1/1999 | Jeong .................... | 365/230.06 |
| 5,943,289 A | * 8/1999 | Ahu et al. .............. | 365/230.06 |
| 5,970,017 A | * 10/1999 | Morigami .............. | 365/230.06 |
| 6,078,542 A | 6/2000 | Tomishima ............ | 365/230.03 |
| 6,160,753 A | 12/2000 | Shibayama ............ | 365/230.03 |
| 6,181,636 B1 | 1/2001 | Lee et al. .............. | 365/230.03 |
| 6,304,509 B1 | * 10/2001 | Hirobe et al. .......... | 365/230.06 |
| 6,314,042 B1 | * 11/2001 | Tomishima et al. .... | 365/230.03 |

* cited by examiner

Primary Examiner—Trong Phan
(74) Attorney, Agent, or Firm—McDermott, Will & Emery

(57) ABSTRACT

The semiconductor memory device includes a memory cell array, a block selection circuit, a row decoder, a word driver, and a column decoder. The memory cell array includes a plurality of memory cells, a plurality of main word lines and a plurality of bit line pairs. The plurality of main word lines are provided corresponding to the rows, that is, m main word lines are provided per row (where m is an integer equal to or greater than two). The plurality of bit line pairs are provided corresponding to the columns. The memory cell array is divided into a plurality of memory blocks in the column direction. Each of the plurality of memory blocks further includes a plurality of sub word lines. The plurality of sub word lines are provided corresponding to the rows. Each of the plurality of sub word lines is connected to one of the m main word lines of the corresponding row.

6 Claims, 13 Drawing Sheets

SEMICONDUCTOR MEMORY DEVICE HAVING HIERARCHICAL WORD LINE STRUCTURE

BACKGROUND OF THE INVENTION

The present invention generally relates to a semiconductor memory device. More particularly, the present invention relates to a semiconductor memory device having a hierarchical word line structure (main word lines and sub word lines).

Recently, improved integration and reduced power consumption have been increasingly implemented in the LSIs (Large Scale Integrated Circuits) including those for portable equipments. The data read/write operations with reduced power consumption have been demanded particularly in the semiconductor memory devices such as SRAM (Static Random Access Memory).

FIG. 13 is a block diagram showing the structure of a conventional SRAM. In the SRAM of FIG. 13, a memory cell array MA100 is divided into a plurality of memory blocks BK10, BK11. This SRAM has a hierarchical word line structure including main word lines MWL100, MWL101 and sub word lines SWL100, SWL110, SWL101, SWL111. Sub word drivers SWD100, SWD101 are provided for the memory block BK10, and sub word drivers SWD110, SWD111 are provided for the memory block BK11.

Hereinafter, operation of the SRAM of FIG. 13 will be described.

First, bit line pairs BL100 to BL103, BL110 to BL113 in the respective memory blocks BK10, BK11 are precharged to a prescribed potential.

Then, a column decoder 121 selects a corresponding column in response to a column address signal. A column selection circuit 122 connects a bit line pair BL100 to BL103, BL110 to BL113 corresponding to the column selected by the column decoder 121 to an input/output (I/O) line pair IO. In response to the column address signal, a block selection circuit 123 activates a corresponding block selection signal BS10, BS11. Either the memory block BK10 or BK11 is thus selected.

A row decoder 124 selects a corresponding row in response to a row address signal. A main word line driver 125 activates a main word line MWL100, MLW101 corresponding to the row selected by the row decoder 124.

A sub word driver SWD100, SWD101, SWD110, SWD111 receives at its inputs the active block selection signal BS10, BS11 and a voltage on the activated main word line MWL100, MWL101, and activates a corresponding sub word line SWL100, SWL101, SWL110, SWL111.

The data is then written to/read from a memory cell MC corresponding to both the sub word line SWL100, SWL101, SWL110, SWL111 thus activated by the sub word driver SWD100, SWD101, SWD110, SWD111 and the bit line pair BL100 to BL103, BL110 t o BL113 connected to the I/O line pair IO by the column selection circuit 122.

In the SRAM of FIG. 13, the sub word drivers SWD100, SWD101, SWD110, SWD111 are arranged within the memory cell array MA100, increasing the layout area of the memory cell array MA100.

Moreover, the SRAM of FIG. 13 includes the sub word drivers (SWD100, SWD101), (SWD110, SWD111) for the memory blocks BK10, BK11. when each memory block BK10, BK11 ha s a small number of columns, a small number of memory cells MC are connected to the corresponding sub word drivers SWD100, SWD101, SWD110, SWD111. The rate of the area to be occupied by the memory cells MC in the memory cell array MA100 is therefore reduced.

SUMMARY OF THE INVENTION

It is an object of the present invention to provide a semiconductor memory device capable of reducing the layout area of a memory cell array.

It is another object of the present invention to provide a semiconductor memory device capable of increasing the rate of the area to be occupied by the memory cells in the memory cell array.

A semiconductor memory device according to the present invention includes a memory cell array, a block selection circuit, a row decoder, a word driver and a column decoder.

The memory cell array includes a plurality of memory cells, a plurality of main word lines and a plurality of bit line pairs. The plurality of memory cells are arranged in rows and columns. The plurality of main word lines are arranged in the rows, that is, m main word lines are arranged per row (where m is an integer equal to or greater than two). The plurality of bit line pairs are arranged in the columns. The memory cell array is divided into a plurality of memory blocks in the column direction. Each of the plurality of memory blocks further includes a plurality of sub word lines. The plurality of sub word lines are arranged in the rows. Each of the plurality of sub word lines is connected to one of the m main word lines arranged in the corresponding row.

The block selection circuit selects a corresponding one of the plurality of memory blocks in response to a column address signal. The row decoder selects a corresponding row in response to a row address signal. The word driver activates one of the m main word lines, arranged in the row selected by the row decoder, which is connected to the sub word line included in the memory block selected by the block selection circuit. The column decoder selects a corresponding column in response to the column address signal.

In this semiconductor memory device, the row decoder selects a row according to the row address signal. The block selection circuit selects one of the plurality of memory blocks according to the column address signal. The word driver activates one of the m main word lines arranged in the row selected by the row decoder, which is connected to the sub word line included in the memory block selected by the block selection circuit. The sub word line connected to the activated main word line is thus activated. Then, the column decoder selects a column according to the column address signal. The data is thus written to/read from the memory cell specified by the activated sub word line and the column selected by the column decoder.

As described above, this semiconductor memory device includes a plurality of main word lines, i.e., m main word lines per row (where m is an integer equal to or greater than two), a plurality of sub word lines each connected to one of the m main word lines arranged in a corresponding row, and the word driver. This eliminates the need to provide a sub word driver within the memory cell array, allowing for reduction in layout area of the memory cell array. Moreover, since no sub word driver need be provided in each of the plurality of memory blocks, the rate of the area to be occupied by the memory cells in the memory cell array can be increased.

Preferably, the semiconductor memory device further includes n first input/output (I/O) line pairs (where n is a positive integer) and a first column selection circuit. The column decoder selects n columns from the memory block selected by the block selection circuit, in response to the column address signal. The first column selection circuit connects bit line pairs corresponding to the n columns selected by the column decoder to the n first I/O line pairs.

In this semiconductor memory device, data is transmitted between n memory cells and n first I/O line pairs. The n memory cells are specified by both one of the plurality of sub word lines included in the memory block selected by the block selection circuit, i.e., a sub word line connected to the main word line activated by the word driver, and bit line pairs corresponding to the n columns selected by the column decoder.

Preferably, the column decoder further selects p first I/O line pairs from the n first I/O line pairs in response to the column address signal (where p is a positive integer). The semiconductor memory device further includes p second I/O line pairs, and a second column selection circuit. The second column selection circuit connects the p first I/O line pairs selected by the column decoder to the p second I/O line pairs.

In this semiconductor memory device, data is transmitted between p memory cells of the n memory cells and p second I/O line pairs. The n memory cells are specified by both one of the plurality of sub word lines included in the memory block selected by the block selection circuit, i.e., a sub word line connected to the main word line activated by the word driver, and n bit line pairs selected by the column decoder. The p memory cells correspond to the p first I/O line pairs selected by the second column selection circuit.

Preferably, the semiconductor memory device further includes n first I/O line pairs (where n is a positive integer), and p second I/O line pairs (where p is a positive integer), a first column selection circuit, and a second column selection circuit. The column decoder selects n bit line pairs in response to the column address signal. The n bit line pairs include p bit line pairs included in the memory block selected by the block selection circuit. The first column selection circuit connects the n bit line pairs selected by the column decoder to the n first I/O line pairs. The second column selection circuit connects to the p second I/O line pairs p first I/O line pairs of the n first I/O line pairs, which are connected to the p bit line pairs included in the memory block selected by the block selection circuit.

In this semiconductor memory device, data is transmitted between p memory cells and p second I/O line pairs. The p memory cells are specified by both one of the plurality of sub word lines included in the memory block selected by the block selection circuit, i.e., a sub word line connected to the main word line activated by the word driver, and p bit line pairs of the n bit line pairs selected by the column decoder, i.e., p bit line pairs included in the memory block selected by the block selection circuit.

Preferably, each of a plurality of sub word lines included in one of the plurality of memory blocks and each of a plurality of sub word lines included in a memory block adjacent to the memory block are connected to one of the m main word lines arranged in the corresponding row through a common line. This semiconductor memory device allows for a simplified structure.

Preferably, the semiconductor memory device further includes a precharge circuit. The precharge circuit precharges a plurality of bit line pairs included in the memory block selected by the block selection circuit to a prescribed potential.

In this semiconductor memory device, the precharge circuit conducts the precharge operation in the memory block selected by the block selection circuit, allowing for reduction in power consumption.

DESCRIPTION OF THE PREFERRED EMBODIMENTS

Figure 1:
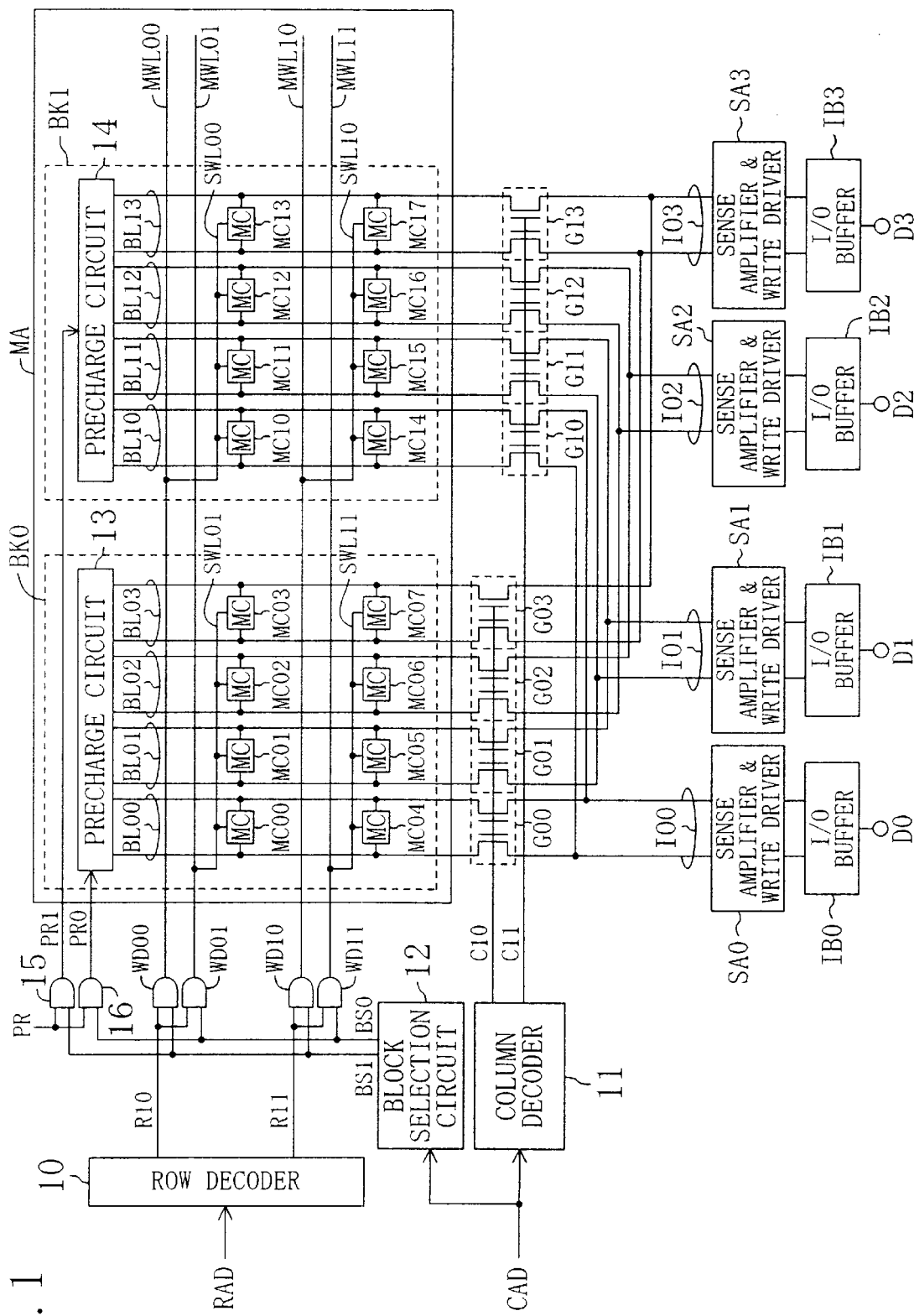
FIG. 1 is a block diagram showing the structure of an SRAM according to a first embodiment of the present invention.

Hereinafter, embodiments of the present invention will be described in detail in conjunction with the accompanying drawings. Note that the same or corresponding portions are denoted with the same reference numerals and characters throughout the figures, and detail description thereof will not be repeated.

First Embodiment

[Overall Structure]

FIG. 1 is a block diagram showing the overall structure of an SRAM (Static Random Access Memory) according to the first embodiment of the present invention. Referring to FIG. 1, this SRAM includes a memory cell array MA, a row decoder 10, a column decoder 11, a block selection circuit 12, precharge circuits 13, 14, AND gates WD00, WD01, WD10, WD11, 15, 16, column selection gates G00 to G03, G10 to G13, input/output (I/O) line pairs IO0 to IO3, sense amplifiers & write drivers SA0 to SA3, and input/output (I/O) buffers IB0 to IB3.

The memory cell array MA includes memory cells MC00 to MC7, MC10 to MC17, main word lines MWL00, MWL01, MWL10, MWL11, and bit line pairs BL00 to BL03, BL10 to BL13. The memory cells MC0 to MC07, MC10 to MC17 are arranged in rows and columns. The memory cells MC00 to MC03, MC10 to MC13 are arranged in a first row. The memory cells MC04 to MC07, MC14 to MC17 are arranged in a second row. The main word lines MWL00, MWL01, MWL10, MWL11 are arranged in the rows. Two main word lines are herein arranged per row. More specifically, the main word lines MWL00, MWL01 are arranged in the first row, and the main word lines MWL10, MWL11 are arranged in the second row. The bit line pairs BL0 to BL03, BL10 to BL13 are arranged in the columns.

The memory cell array MA is divided into two memory blocks BK0, BK1 in the column direction. The memory block BK0 includes the memory cells MC00 to MC07 and the bit line pairs BL00 to BL03. The memory block BK0 further includes sub word lines SWL01, SWL11. The sub word line SWL01 is arranged in the first row, and is connected to the main word line MWL01. The sub word line SWL11 is arranged in the second row, and is connected to the main word line MWL11. The memory block BK1 includes the memory cells MC10 to MC17 and the bit line pairs BL10 to BL13. The memory block BK1 further includes sub word lines SWL00, SWL10. The sub word line SWL10 is arranged in the first row, and is connected to the main word line MWL00. The sub word line SWL10 is arranged in the second row, and is connected to the main word line MWL10. Note that the main word lines MWL00, MWL01 are arranged in the first row longitudinally across the memory blocks BK0, BK1. The main word lines MWL10, MWL11 are arranged in the second row longitudinally across the memory blocks BK0, BK1.

The row decoder 10 selects a corresponding row in response to a row address signal RAD. The row decoder 10 outputs an active row selection signal R10 in order to select the first row, and outputs an active row selection signal R11 in order to select the second row.

The block selection circuit 12 selects a corresponding memory block BK0, BK1 in response to a column address signal CAD. The block selection circuit 12 outputs an active block selection signal BS0 in order to select the memory block BK0, and outputs an active block selection signal BS1 in order to select the memory block BK1.

The AND gate 15 outputs the AND operation result of a precharge signal PR and the block selection signal BS1 as a precharge signal PR1. The AND gate 16 outputs the AND operation result of the precharge signal PR and the block selection signal BS0 as a precharge signal PR0.

The precharge circuit 13 precharges the bit line pairs BL00 to BL03 in the memory block BK0 to a prescribed potential (half the power supply voltage) in response to the precharge signal PR0. The precharge circuit 14 precharges the bit line pairs BL10 to BL13 in the memory block BK1 to a prescribed potential (half the power supply voltage) in response to the precharge signal PR1.

The AND gate WD00 outputs the AND operation result of the row selection signal R10 and the block selection signal BS1 to the main word line MWL00. The AND gate WD01 outputs the AND operation result of the row selection signal R10 and the block selection signal BS0 to the main word line MWL01. The AND gate WD10 outputs the AND operation result of the row selection signal R11 and the block selection signal BS1 to the main word line MWL10. The AND gate WD11 outputs the AND operation result of the row selection signal R11 and the block selection signal BS0 to the main word line MWL11. Note that the AND gates WD00, WD01, WD10, WD11 form a word driver.

The column decoder 11 selects corresponding columns in response to the column address signal CAD. More specifically, in response to the column address signal CAD, the column decoder 11 selects four columns from the block BK0, BK1 selected by the block selection circuit 12. The column decoder 11 outputs an active column selection signal C10 in order to select four columns in the memory block BK0 (the bit line pairs BL00 to BL03 correspond to the four columns), and outputs an active column selection signal C11 in order to select four columns in the memory block BK1 (the bit line pairs BL10 to BL13 correspond to the four columns).

The column selection gates G00 to G03 are connected between the bit line pairs BL00 to BL03 and the I/O line pairs IO0 to IO3, respectively. The column selection gates G00 to G03 respectively connect/disconnect the bit line pairs BL00 to BL03 to/from the I/O line pairs IO0 to IO3 in response to the column selection signal C10.

The column selection gates G10 to G13 are connected between the bit line pairs BL10 to BL13 and the I/O line pairs IO0 to IO3, respectively. The column selection gates G10 to G13 respectively connect/disconnect the bit line pairs BL10 to BL13 to/from the I/O line pairs IO0 to IO3 in response to the column selection signal C11.

Note that the column selection gates G00 to G03, G10 to G13 form a first column selection circuit. The I/O line pairs IO0 to IO3 each forms a first I/O line pair.

The sense amplifiers & write drivers SA0 to SA3 amplify the data in the memory cells MC00 to MC07, MC10 to MC17 read onto the I/O line pairs IO0 to IO3, respectively. The sense amplifiers & write drivers SA0 to SA3 write the data from the I/O buffers IB0 to IB3 to the memory cells MC00 to MC07, MC10 to MC17 through the I/O line pairs IO0 to IO3 and the bit line pairs BL00 to BL03, BL10 to BL13, respectively.

The I/O buffers IB0 to IB3 externally output the data amplified by the sense amplifiers & write drivers SA0 to SA3, and transfer the external data to the sense amplifiers & write drivers SA0 to SA3, respectively.

[Memory Cell Structure]

Figure 2:
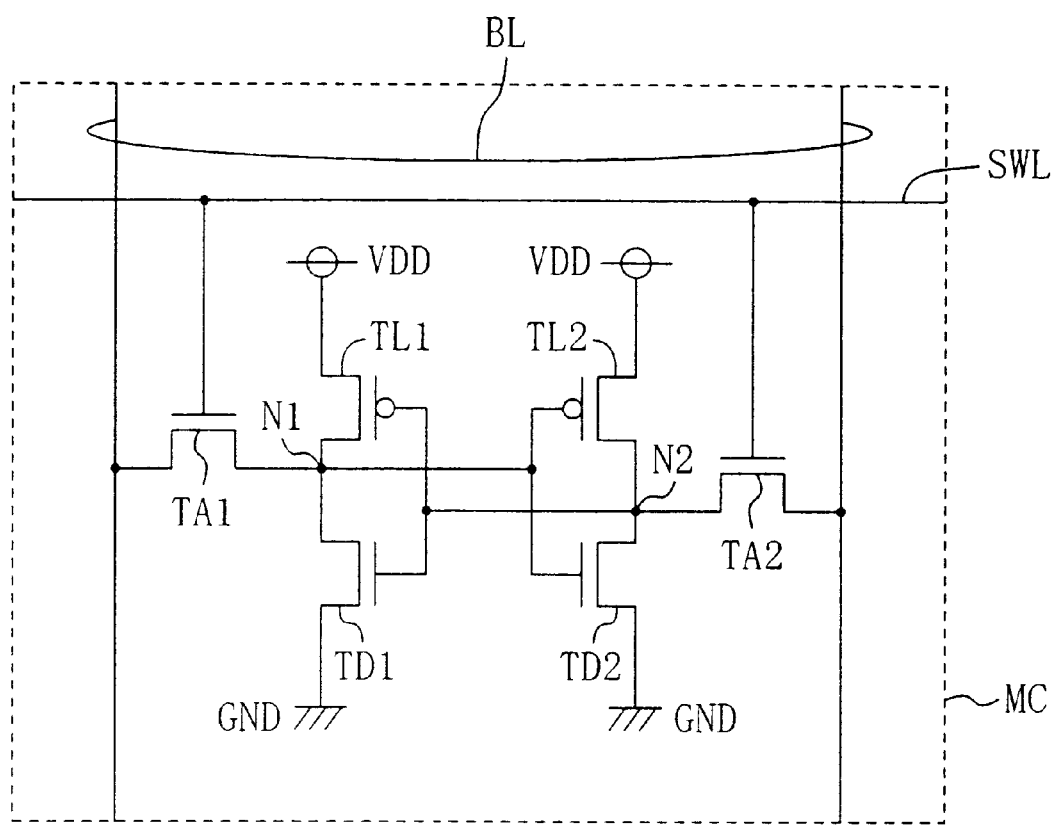
FIG. 2 is a circuit diagram showing the structure of a memory cell in FIG. 1.

FIG. 2 is a circuit diagram showing the internal structure of each memory cell MC00 to MC07, MC10 to MC17 in FIG. 1.

Referring to FIG. 2, the memory cell MC includes load transistors (P-channel MOS transistors) TL1, TL2, drive transistors (N-channel MOS transistors) TD1, TD2, and access transistors (N-channel MOS transistors) TA1, TA2.

The load transistor TL1 is connected between a power supply node VDD receiving the power supply voltage and a node N1. The drive transistor TD1 is connected between the node N1 and a ground node GND. The load transistor TL1 and the drive transistor TD1 have their respective gates connected to a node N2. The load transistor TL2 is connected between the power supply node VDD and the node N2. The drive transistor TD2 is connected between the node N2 and the ground node GND. The load transistor TL2 and the drive transistor TD2 have their respective gates connected to the node N1. The access transistor TA1 is connected between the node N1 and one bit line of the bit line pair BL. The access transistor TA2 is connected to between the node N2 and the other bit line of the bit line pair BL. The access transistors TA1, TA2 have their respective gates connected to the sub word line SWL.

The memory cell MC having such a structure holds 1-bit complementary data signals at the nodes N1, N2. The access transistors TA1, TA2 are turned ON in response to activation of the sub word line SWL. The complementary data signals held at the nodes N1, N2 are thus read onto the bit line pair BL. The data is thus read from the memory cell MC. In order to write the data to the memory cell MC, complementary data signals to be written are applied to the bit line pair BL with the access transistors TA1, TA2 being turned ON. The voltage levels at the nodes N1, N2 are thus replaced with the levels of the complementary data signals applied to the bit line pair BL. The access transistors TA1, TA2 are then turned OFF, so that the complementary data signals are held at the nodes N1, N2. The data is thus written to the memory cell MC.

[Structure of Precharge Circuit]

Figure 3:
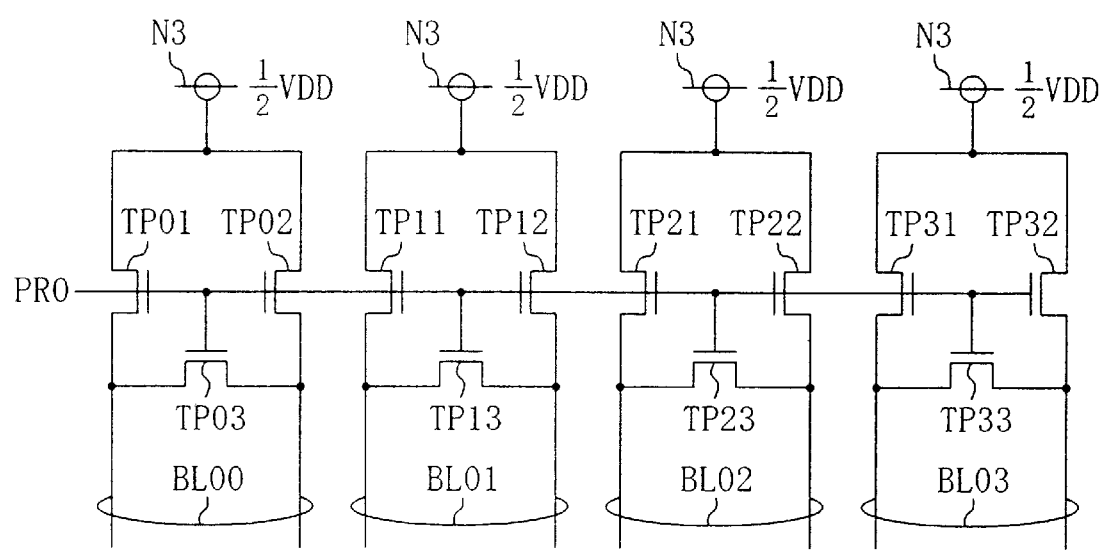
FIG. 3 is a circuit diagram showing the structure of a precharge circuit in FIG. 1.
Figure 13:
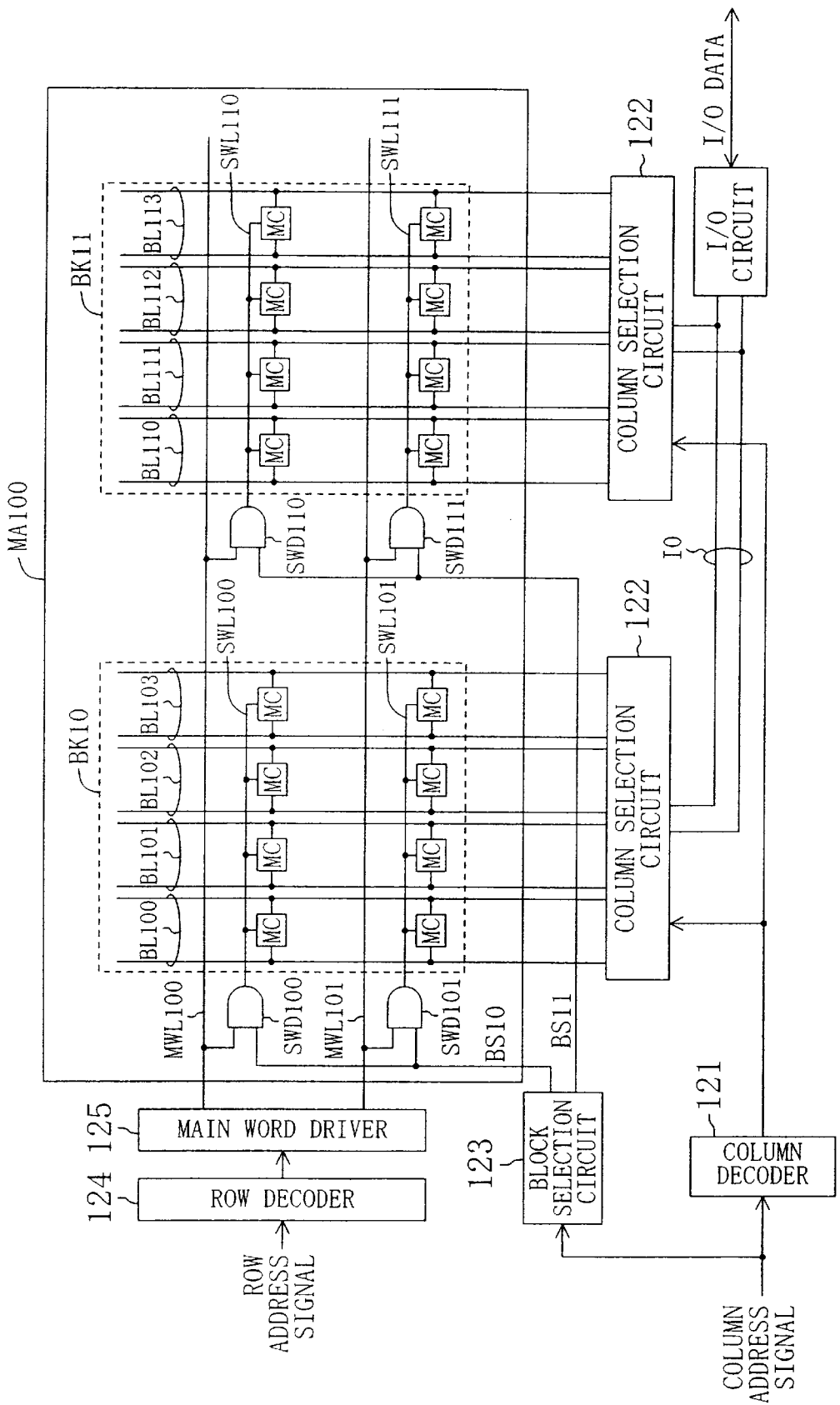
FIG. 13 is a circuit diagram showing the overall structure of a conventional SRAM.

FIG. 3 is a circuit diagram showing the internal structure of the precharge circuit 13 in FIG. 1. Referring to FIG. 13, the precharge circuit 13 includes precharge transistors TP01 to TP03, TP11 to TP13, TP21 to TP23, TP31 to TP33.

The precharge transistors TP01, TP11, TP21, TP31 are each connected between a node N3 receiving half the power supply voltage (½ VDD) and one bit line of the corresponding bit line pair BL00, BL01, BL02, BL03. The precharge transistors TP02, TP12, TP22, TP32 are each connected between the node N3 receiving half the power supply voltage (½ VDD) and the other bit line of the corresponding bit line pair BL00, BL01, BL02, BL03. The precharge transistors TP03, TP13, TP23, TP33 are each connected to one bit line and the other bit line of the corresponding bit line pair BL00, BL01, BL02, BL03.

In the precharge circuit 13 having such a structure, the precharge transistors TP0 to TP03, TP11 to TP13, TP21 to TP23, TP31 to TP33 are turned ON in response to activation of the precharge signal PR0. The node N3 is thus connected to the bit line pairs BL00 to BL03. As a result, the bit line pairs BL00 to BL03 have a potential level equal to half the power supply voltage (½ VDD). The bit line pairs BL00 to BL03 are thus precharged. Note that the precharge circuit 14 has the same structure as that of the precharge circuit 13.

[Operation]

Hereinafter, operation of the SRAM structured as described above will be described. Note that, for simplicity, the description will be given for the following cases: (1) read the data from the memory cells MC00 to MC03 in the memory block BK0; and (2) write the data to the memory cells MC14 to MC17 in the memory block BK1.

(1) Read the data from the memory cells MC00 to MC03 in the memory block BK0:

In response to the row address signal RAD, the row decoder 10 outputs an active row selection signal R01 and an inactive row selection signal R11. In response to the column address signal CAD, the block selection circuit 12 outputs an active block selection signal BS0 and an inactive block selection signal BS1.

The precharge signal PR is then activated for a prescribed period. In response to this, the precharge signal PR0 is activated for a prescribed period. The precharge signal PR1 remains inactive. In response to the active precharge signal PR0, the precharge transistors TP01 to TP03, TP11 to TP13, TP21 to TP23, TP31 to TP33 (see FIG. 3) in the precharge circuit 13 are turned ON. The bit line pairs BL00 to BL03 in the memory block BK0 are thus precharged. The precharge signal PR is inactivated after the prescribed period. In response to this, the precharge signal PR0 is inactivated. In response to the inactive precharge signal PR0, the precharge transistors TP01 to TP03, TP11 to TP13, TP21 to TP23, TP31 to TP33 (see FIG. 3) in the precharge circuit 13 are turned OFF. The precharge operation is thus completed.

The AND gate WD01 then activates the main word line MWL01 in response to the active row selection signal R10 and the active block selection signal BS0. In response to activation of the main word line MWL01, the sub word line SWL01 connected thereto is also activated. The AND gates WD00, WD10, WD11 inactivate the main word lines MWL00, MWL10, MWL11, respectively.

The access transistors TA1, TA2 (see FIG. 2) in the memory cells MC00 to MC03 are turned ON in response to activation of the sub word line SWL01. The complementary data held at the nodes N1, N2 (see FIG. 2) of the memory cells MC00 to MC03 are thus read onto the bit line pairs BL00 to BL03.

In response to the column address signal CAD, the column decoder 11 outputs an active column selection signal C10 and an inactive column selection signal C11.

In response to the active column selection signal C10, the column selection gates G00 to G03 connect the bit line pairs BL00 to BL03 to the I/O line pairs IO0 to IO3, respectively. The data in the memory cells MC00 to MC03 read onto the bit line pairs BL00 to BL03 are thus transferred onto the I/O line pairs IO0 to IO3, respectively. In response to the inactive column selection signal C11, the column selection gate G10 to G13 disconnects the bit line pairs BL10 to BL13 from the I/O line pairs IO0 to IO3, respectively.

The data in the memory cells MC00 to MC03 transferred onto the I/O line pairs IO0 to IO3 are amplified by the sense amplifiers & write drivers SA0 to SA3 for transfer to the I/O buffers IB0 to IB3, respectively.

The I/O buffers IB0 to IB3 externally output the data transferred from the sense amplifiers & write drivers SA0 to SA3 as read data D0 to D3, respectively.

The data stored in the memory cells MC00 to MC03 are thus externally output as 4-bit data D0 to D3.

(2) Write the data to the memory cells MC14 to MC17 in the memory block BK1:

In response to the row address signal RAD, the row decoder 10 outputs an active row selection signal R11 an inactive row selection signal R10. In response to the column address signal CAD, the block selection circuit 12 outputs an active block selection signal BS1 and an inactive block selection signal BS0.

The precharge signal PR is then activated for a prescribed period. In response to this, the precharge signal PR1 is activated for a prescribed period. The precharge signal PR0 remains inactive. In response to the active precharge signal PR1, the precharge transistors in the precharge circuit 14 are turned ON. The bit line pairs BL10 to BL13 in the memory block BK1 are thus precharged. The precharge signal PR is inactivated after the prescribed period. In response to this, the precharge signal PR1 is inactivated. In response to the inactive precharge signal PR1, the precharge transistors in the precharge circuit 14 are turned OFF. The precharge operation is thus completed.

The AND gate WD10 then activates the main word line MWL10 in response to the active row selection signal R11 and the active block selection signal BS1. In response to activation of the main word line MWL10, the sub word line SWL10 connected thereto is also activated. In response to activation of the sub word line SWL10, the access transistors TA1, TA2 (see FIG. 2) in the memory cells MC14 to MC17 are turned ON. The AND gates WD00, WD01, WD11 inactivate the main word lines MWL00, MWL01, MWL11, respectively.

The I/O buffers IB0 to IB3 receive the external write data D0 to D3 for transfer to the respective sense amplifiers & write buffers SA0 to SA3. The sense amplifiers & write buffers SA0 to SA3 amplify the write data D0 to D3 from the I/O buffers IB0 to IB3 for transfer onto the I/O line pairs IO0 to IO3, respectively.

In response to the column address signal CAD, the column decoder 11 outputs an active column selection signal C11 and an inactive column selection signal C10.

In response to the active column selection signal C11, the column selection gates G10 to G13 connect the bit line pairs BL10 to BL13 to the I/O line pairs IO0 to IO3, respectively. The write data D0 to D3 are thus transferred from the I/O line pairs IO0 to IO3 onto the bit line pair BL10 to BL13, respectively. The data held in the memory cells MC14 to MC17 are replaced with the write data D0 to D3 applied to the bit line pairs BL10 to BL13, respectively. In response to the inactive column selection signal C10, the column selection gates G00 to G03 disconnect the bit line pairs BL00 to BL03 from the I/O line pairs IO0 to IO3, respectively.

The external 4-bit data D0 to D3 are thus written to the memory cells MC14 to MC17.

[Effects]

As has been described above, the SRAM of the first embodiment of the present invention includes two main word lines MWL00, MWL01, MWL10, MWL11 per row, sub word lines SWL01, SWL11, SWL00, SWL10 each connected to one of the two main word lines of the corresponding row, and AND gates WD00, WD01, WD10, WD11. This eliminates the need to provide sub word drivers in the memory cell array MA, allowing for reduction in layout area of the memory cell array MA.

Moreover, since no sub word line driver need be provided in the memory blocks BK0, BK1, the area to be occupied by the memory cells MC00 to MC07, MC10 to MC17 in the memory cell array MA can be increased.

Moreover, the precharge circuit 13, 14 precharges only the bit line pairs in the memory block BK0, BK1 selected by the block selection circuit 12, allowing for reduction in power consumption.

Note that, although two main word lines are herein arranged per row, three or more main word lines may alternatively be arranged per row.

Moreover, although the memory cell array MA is herein divided into two memory blocks BK0, BK1, it may alternatively be divided into three or more memory blocks.

Although the SRAM has been described, the present invention is also applicable to other semiconductor memory devices such as DRAM (Dynamic Random Access Memory) and ROM (Read Only Memory).

Second Embodiment

Figure 4:
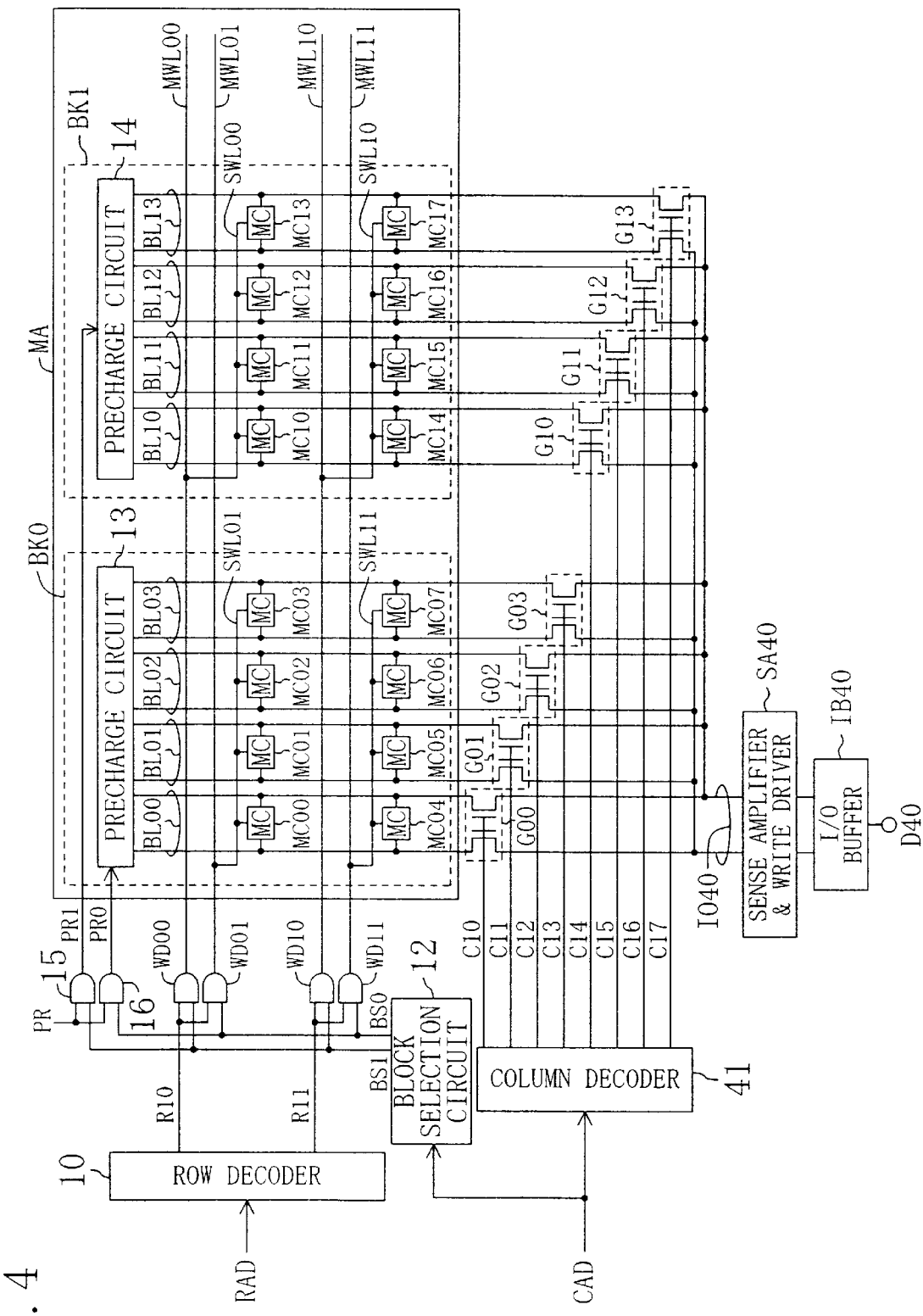
FIGS. 4 to 12 are block diagrams showing the structure of an SRAM according to second to tenth embodiments of the present invention.

FIG. 4 is a block diagram showing the overall structure of the SRAM according to the second embodiment of the present 20 invention. This SRAM is different from that of FIG. 1 in that this SRAM includes only one I/O line pair. Referring to FIG. 4, this SRAM includes a column decoder 41, an I/O line pair IO40, a sense amplifier & write driver SA40 and an I/O buffer IB40 instead of the column decoder 11, the I/O line pairs IO0 to IO3, the sense amplifiers & write drivers SA0 to SA3 and the I/O buffers IB0 to IB3 in the SRAM of FIG. 1. The SRAM of the second embodiment has otherwise the same structure as that of the SRAM in FIG. 1.

In response to a column address signal CAD, the column decoder 41 selects one bit line pair from the memory block BK0, BK1 selected by the block selection circuit 12. The column decoder 41 outputs an active column selection signal C10 to C13 in order to select a bit line pair BL00 to BL03 in the memory block BK0. The column decoder 41 outputs an active column selection signal C14 to C17 in order to select a bit line pair BL10 to BL13 in the memory block BK1.

The column selection gates G00 to G03 are respectively connected between the bit line pairs BL00 to BL03 and the I/O line pair IO40. The column selection gates G00 to G03 connect/disconnect the bit line pairs BL00 to BL03 to/from the I/O line pair IO40 in response to column selection signals C10 to C13, respectively.

The column selection gates G10 to G13 are respectively connected between the bit line pairs BL10 to BL13 and the I/O line pair IO40. The column selection gates G10 to G13 connect/disconnect the bit line pairs BL10 to BL13 to/from the I/O line pair IO40 in response to column selection signal C14 to C17, respectively.

Note that the column selection gates G00 to G03, G10 to G13 form a first column selection circuit. The I/O line pair IO40 forms a first I/O line pair.

The sense amplifier & write driver SA40 amplifies the data in the memory cell MC00 to MC07, MC10 to MC17 read onto the I/O line pair IO40. The sense amplifier & write driver SA40 writes the data from the I/O buffer IB40 to the memory cell MC00 to MC07, MC10 to MC17 through the I/O line pair IO40 and the bit line pair BL00 to BL03, BL10 to BL13.

The I/O buffer IB40 externally outputs the data amplified by the sense amplifier & write driver SA40, and transfers the external data to the sense amplifier & write driver SA40.

The SRAM structured as described above can also achieve the same effects as those in the first embodiment.

Third Embodiment

Figure 5:
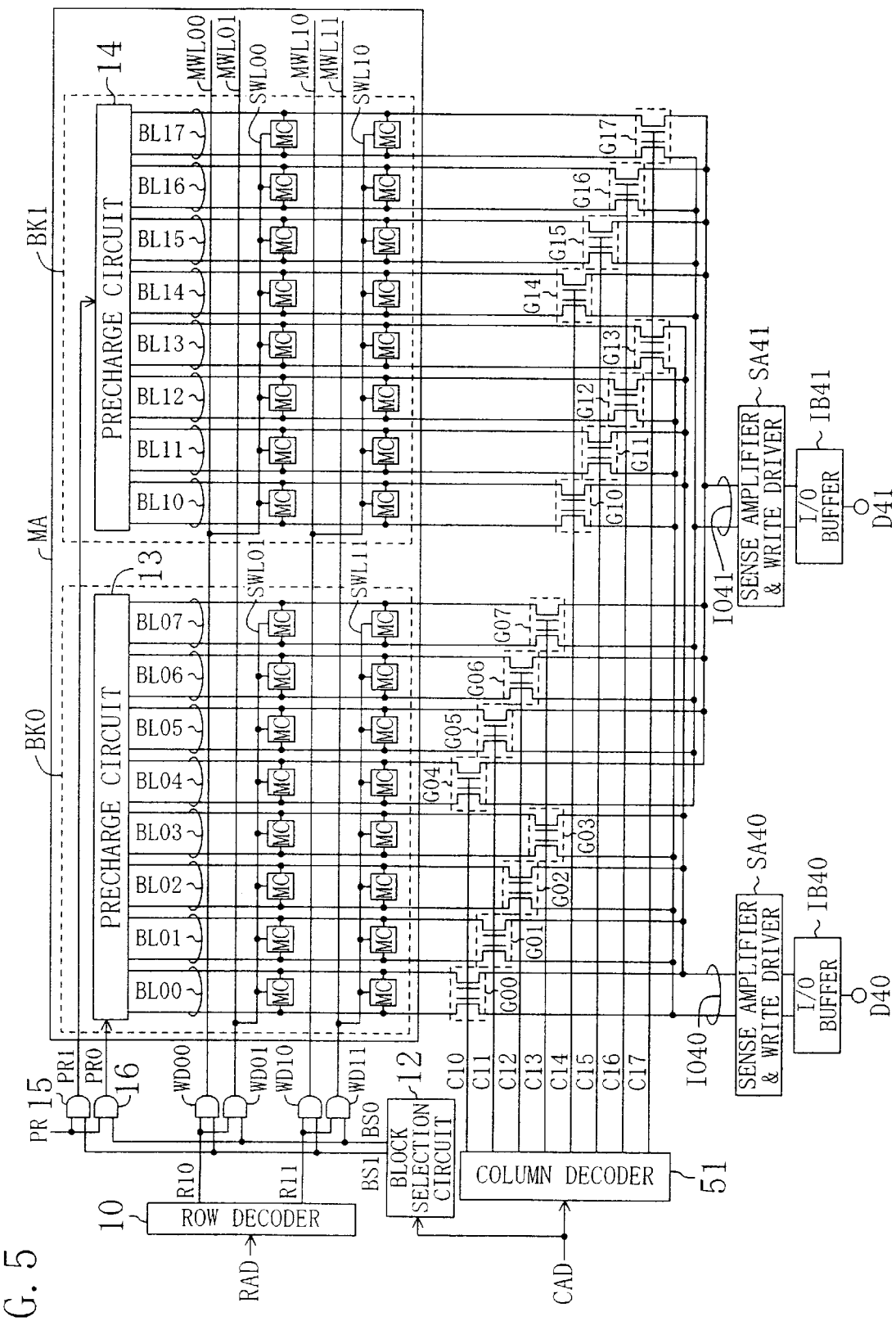

FIG. 5 is a block diagram showing the structure of the SRAM according to the third embodiment of the invention. Referring to FIG. 5, this SRAM includes an I/O line pair IO41, a sense amplifier & write driver SA41, and an I/O buffer IB41 in addition to the elements of the SRAM in FIG. 4. This SRAM selects two bit line pairs from the memory block BK0, BK1 selected by the block selection circuit 12, and connects one of the selected two bit line pairs to the I/O line pair IO40 and connects the other to the I/O line pair IO41.

The sense amplifier & write driver SA41 amplifies the data in the memory cell read onto the I/O line pair IO41 through the bit line pair BL04 to BL07, BL14 to BL17. The sense amplifier & write driver SA41 also writes the data from the I/O buffer IB41 to the memory cell through the I/O line pair IO41 and the bit line pair BL04 to BL07, BL14 to BL17.

The I/O buffer IB41 externally outputs the data amplified by the sense amplifier & write driver SA41, and transfers external data D41 to the sense amplifier & write driver SA41.

In response to a column address signal CAD, the column decoder 51 selects two bit line pairs from the memory block BK0, BK1 selected by the block selection circuit 12. The column decoder 51 outputs an active column selection signal C10 to C13 in order to select two bit line pairs (BL00, BL04), (BL01, BL05), (BL02, BL06), (BL03, BL07) in the memory block BK0. The column decoder 51 outputs an active column selection signal C14 to C17 in order to select two bit line pairs (BL10, BL14), (BL11, BL15), (BL12, BL16), (BL13, BL17) in the memory block BK1.

The column selection gates G00 to G03, G10 to G13 are respectively connected between the bit line pairs BL00 to BL03, BL10 to BL13 and the I/O line pair IO40. The column selection gates G00 to G03, G10 to G13 connect/disconnect the bit line pairs BL00 to BL03, BL10 to BL13 to/from the I/O line pair IO40 in response to the column selection signals C10 to C13, C14 to C17, respectively.

The column selection gates G04 to G07, G14 to G17 are respectively connected between the bit line pairs BL04 to BL07, BL14 to BL17 and the I/O line pair IO41. The column selection gates G04 to G07, G14 to G17 connect/disconnect the bit line pairs BL04 to BL07, BL14 to BL17 to/from the I/O line pair IO41 in response to the column selection signals C10 to C13, C14 to C17, respectively.

Note that the column selection gates G00 to G07, G10 to G17 form a first column selection circuit. The I/O line pairs IO40, IO41 each forms a first I/O line pair.

The SRAM structured as described above can also achieve the same effects as those in the first embodiment.

Fourth Embodiment

Figure 6:
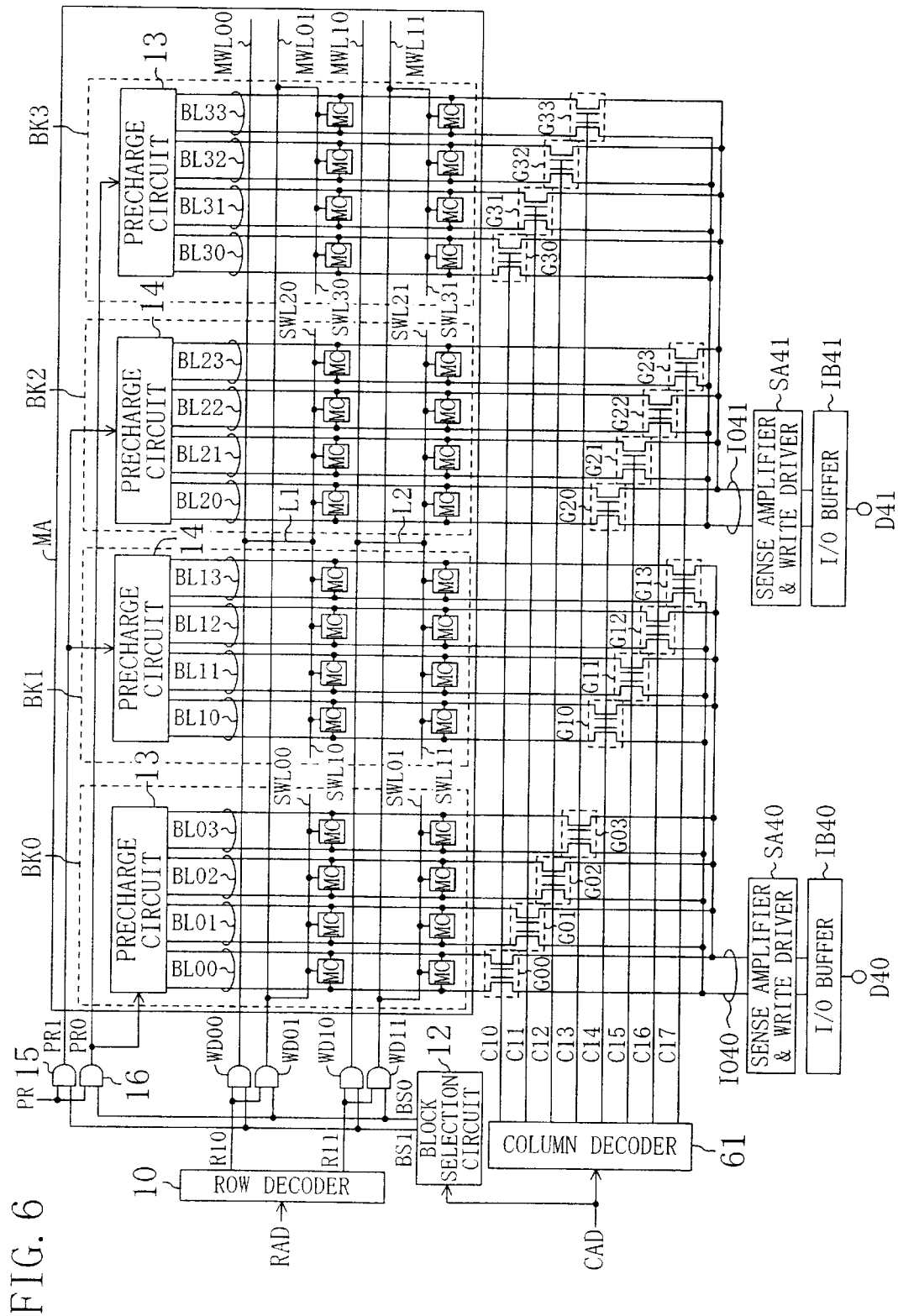

FIG. 6 is a block diagram showing the structure of the SRAM according to the fourth embodiment of the invention. The SRAM of FIG. 6 is different from that of FIG. 5 in that the memory cell array MA includes four memory blocks BK0 to BK3. Each of the memory blocks BK0 to BK3 includes eight (two rows by four columns) memory cells. Sub word lines SWL00, SWL10, SWL20, SWL30 are arranged in a first row in the respective memory blocks BK0 to BK3. Sub word lines SWL01, SWL11, SWL21, SWL31 are arranged in a second row in the respective memory blocks BK0 to BK3.

The sub word lines SWL10, SWL20 included in the adjacent memory blocks BK1, BK2 are connected to the main word line MWL00 through a common line L1. The sub word lines SWL11, SWL21 included in the adjacent memory blocks BK1, BK2 are connected to the main word line MWL10 through a common line L2. Thus, connecting the sub word lines (SWL10, SWL20), (SWL11, SWL21) included in the adjacent memory blocks BK1, BK2 to the main word lines MWL00, MWL10 through the common lines L1, L2, respectively, can simplify the structure.

The sub word lines SWL00, SWL30 are connected to the main word line MWL01, and the sub word lines SWL01, SWL31 are connected to the main word line MWL11.

In this SRAM, two sub word lines are connected to each main word line. Two sub word lines connected to each main word line are included in separate memory blocks. Accordingly, the block selection circuit 12 selects two memory blocks simultaneously. The block selection circuit 12 outputs an active block selection signal BS0 in order to select two memory blocks BK0, BK3. The block selection circuit 12 outputs an active block selection signal BS1 in order to select two memory blocks BK1, BK2.

In response to a column address signal CAD, the column decoder 61 selects one bit line pair from each of the two memory blocks selected by the block selection circuit 12. In other words, the column decoder 61 selects two bit line pairs in total. The column decoder 61 outputs active an column selection signal C10 to C13 in order to select two bit line pairs (BL00, BL30), (BL01, BL31), (BL02, BL32), (BL03, BL33) from the memory blocks BK0, BK3. The column decoder 61 outputs an active column selection signal C14 to C17 in order to select two bit line pairs (BL10, BL20), (BL11, BL21), (BL12, BL22), (BL13, BL23) from the memory blocks BK1, BK2.

Column selection gates G00 to G03, G10 to G13 are respectively connected between the bit line pairs BL00 to BL03, BL10 to BL13 and the I/O line pair IO40. The column selection gates G00 to G03, G10 to G13 connect/disconnect the bit line pairs BL00 to BL03, BL10 to BL13 to/from the I/O line pair IO40 in response to the column selection signals C10 to C13, C14 to C17, respectively.

Column selection gates G20 to G23, G30 to G33 are respectively connected between the bit line pairs BL20 to BL23, BL30 to BL33 and the I/O line pair IO41. The column selection gates G20 to G23, G30 to G33 connect/disconnect the bit line pairs BL20 to BL23, BL30 to BL33 to/from the I/O line pair IO41 in response to the column selection signals C14 to C17, C10 to C13, respectively.

Note that the column selection gates G00 to G03, G10 to G13, G20 to G23, G30 to G33 form a first column selection circuit. The I/O line pairs IO40, IO41 each forms a first I/O line pair.

The SRAM structured as described above can also achieve the same effects as those in the first embodiment.

Fifth Embodiment

Figure 7:
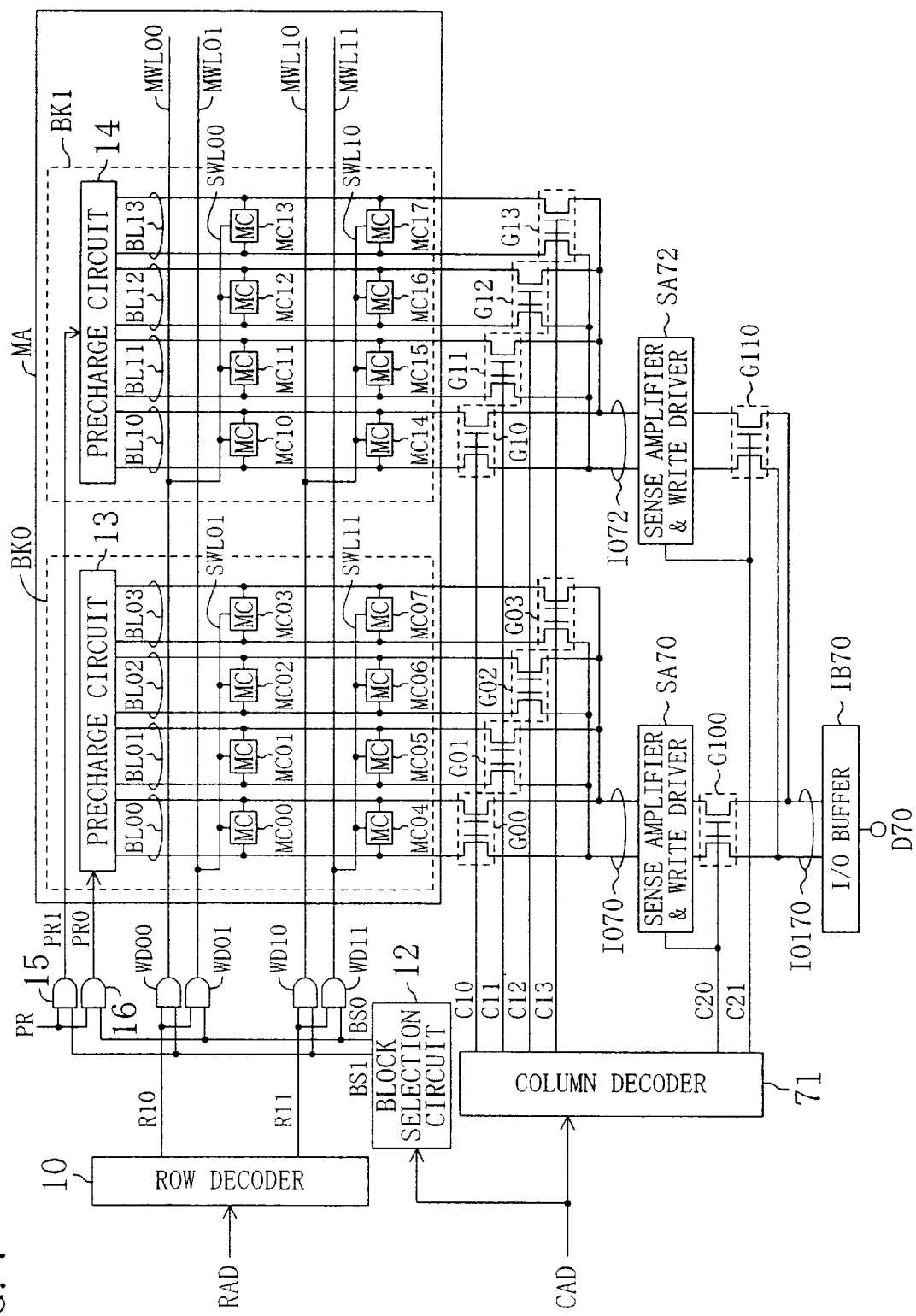

FIG. 7 is a block diagram showing the structure of the SRAM according to the fifth embodiment of the present invention. This SRAM is different from that of FIG. 1 in that this SRAM includes two first I/O line pairs IO70, IO72 and a single second I/O line pair IO170. Referring to FIG. 7, this SRAM includes a column decoder 71, I/O line pairs IO70, IO72, IO170, sense amplifiers & write drivers SA70, SA72, column selection gates G100, G110 and an I/O buffer IB70 instead of the column decoder 11, the I/O line pairs IO0 to IO3, the sense amplifiers & write drivers SA0 to SA3 and the I/O buffers IB0 to IB3 in the SRAM of FIG. 1. This SRAM has otherwise the same structure as that of the SRAM in FIG. 1.

The column decoder 71 selects one bit line pair from each of the memory blocks BK0, BK1 in response to a column address signal CAD. In other words, the column decoder 71 selects two bit line pairs in total. The column decoder 71 outputs an active column selection signal C10 to C13 in order to select two bit line pairs (BL00, BL10), (BL01, BL11), (BL02, BL12), (BL03, BL13) from the memory blocks BK0, BK1. In response to the column address signal CAD, the column decoder 71 selects one of the I/O line pairs IO70, IO72 that is connected to the bit line pair of the memory block BK0, BK1 selected by the block selection circuit 12. The column decoder 71 outputs an active column selection signal C20 in order to select the I/O line pair IO70, and outputs an active column selection signal C21 in order to select the I/O line pair IO72.

The column selection gates G00 to G03 are respectively connected between the bit line pairs BL00 to BL03 and the I/O line pair IO70. The column selection gates G00 to G03 connect/disconnect the bit line pairs BL00 to BL03 to/from the I/O line pair IO70 in response to the column selection signals C10 to C13, respectively.

The column selection gates G10 to G13 are respectively connected between the bit line pairs BL10 to BL13 and the I/O line pair IO72. The column selection gates G10 to G13 connect/disconnect the bit line pairs BL10 to BL13 to/from the I/O line pair IO72 in response to the column selection signals C10 to C13, respectively.

The column selection gate G100 is connected between the I/O line pairs IO70 and IO170. The column selection gate G100 connects/disconnects the I/O line pair IO70 to/from the I/O line pair IO170 in response to the column selection signal C20. The column selection gate G110 is connected between the I/O line pairs IO72 and IO170. The column selection gate G110 connects/disconnects the I/O line pair IO72 to/from the I/O line pair IO170 in response to the column selection signal C21.

Note that the column selection gates G00 to G03, G10 to G13 form a first column selection circuit. The column s election gates G100, G110 form a second column selection circuit. The I/O line pairs IO70, IO72 each forms a first I/O line pair. The I/O line pair IO170 forms a second I/O line pair.

The sense amplifier & write driver SA70, SA72 is respectively activated in response to the column selection signal C20, C21, and amplifies the data in the memory cell read onto the I/O line pair IO70, IO72. The sense amplifier & write driver SA70, SA72 is respectively activated in response to the column selection signal C20, C21, and writes the data from the I/0 buffer IB70 to the memory cell through the I/O line pair IO70, IO72 and the bit line pair BL00 to BL03, BL10 to BL13.

The I/O buffer IB70 externally outputs the data transferred from the I/O line pair IO70, IO72 onto the I/O line pair IO170, and transfers the external data onto the I/O line pair IO170.

The SRAM structured as described above can also achieve the same effects as those in the first embodiment.

Sixth Embodiment

Figure 8:
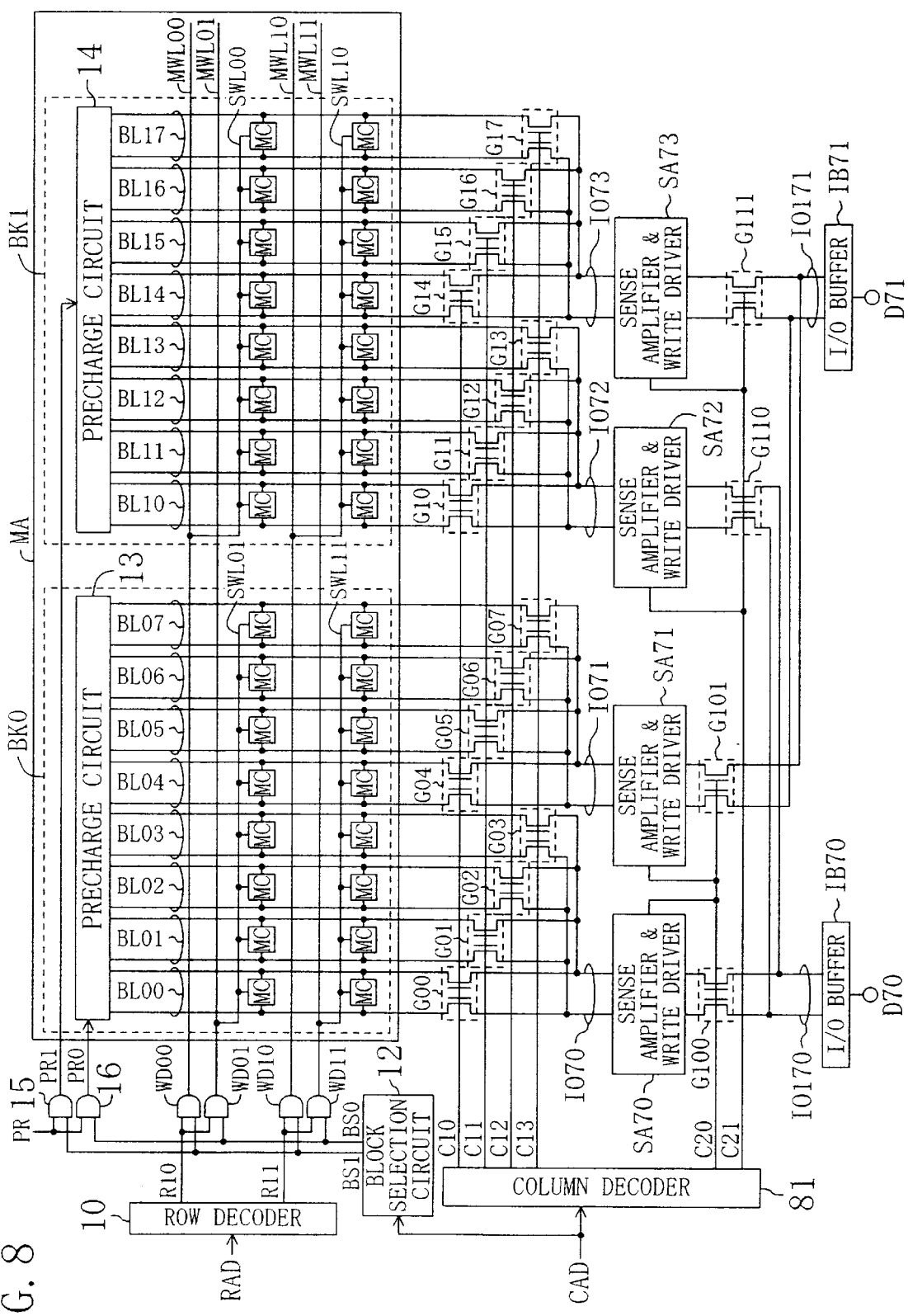

FIG. 8 is a block diagram showing the structure of the SRAM according to the sixth embodiment of the present invention. Referring to FIG. 8, this SRAM further includes I/O line pairs IO71, IO73, IO171, sense amplifiers & write drivers SA71, SA73, and an input buffer IB71 in addition to the elements of the SRAM in FIG. 7.

This SRAM selects two bit line pairs from each of the memory blocks BK0, BK1. In other words, this SRAM selects four bit line pairs in total. Of the selected four bit line pairs, one of the two bit line pairs in the memory block selected by the block selection circuit 12 is connected to the I/O line pair IO170, and the other is connected to the I/O line pair IO171.

The column decoder 81 selects two bit line pairs from each of the memory blocks BK0, BK1 in response to a column address signal CAD. In other words, the column decoder 81 selects four bit line pairs in total. The column decoder 81 outputs an active column selection signal C10 to C13 in order to select four bit line pairs (BL00, BL04, BL10, BL14), (BL01, BL05, BL11, BL15), (BL02, BL06, BL12, BL16), (BL03, BL07, BL13, BL17) from the memory blocks BK0, BK1. In response to the column address signal CAD, the column decoder 81 selects two of the I/O line pairs IO70 to IO73 that are respectively connected to the bit line pairs in the memory block BK0, BK1 selected by the block selection circuit 12. The column decoder 81 outputs an active column selection signal C20 in order to select the I/O line pairs IO70, IO71, and outputs an active column selection signal C21 in order to select the I/O line pairs IO72, IO73.

The column selection gates G00 to G03, G04 to G07 are respectively connected between the bit line pairs BL00 to BL03, BL04 to BL07 and the I/O line pairs IO70, IO71. The column selection gates G00 to G03, G04 to G07 connect/disconnect the bit line pairs BL00 to BL03, BL04 to BL07 to/from the I/O line pairs IO70, IO71 in response to the column selection signals C10 to C13, respectively.

The column selection gates G10 to G13, G14 to G17 are respectively connected between the bit line pairs BL10 to BL13, BL14 to BL17 and the I/O line pairs IO72, IO73. The column selection gates G10 to G13, G14 to G17 connect/disconnect the bit line pairs BL10 to BL13, BL14 to BL17 to/from the I/O line pairs IO72, IO73 in response to the column selection signals C10 to C13, respectively.

The column selection gates G100, G101 are respectively connected between the I/O line pairs IO70, IO71 and the I/O line pairs IO170, IO171. The column selection gate G100, G101 connect/disconnect the I/O line pairs IO70, IO71 to/from the I/O line pairs IO170, 10171 in response to the column selection signal C20, respectively. The column selection gates G110, G111 are respectively connected between the I/O line pairs IO72, IO73 and the I/O line pairs IO170, IO171. The column selection gates G110, G111 connect/disconnect the I/O line pairs IO72, IO73 to/from the I/O line pairs IO170, IO171 in response to the column selection signal C21, respectively.

Note that the column selection gates G00 to G07, G10 to G17 form a first column selection circuit. The column selection gates G100, G101, G110, G111 form a second column selection circuit. The I/O line pairs IO70 to IO73 each forms a first I/O line pair. The I/O line pairs IO170, IO171 each forms a second I/O line pair.

The sense amplifier & write driver SA70, SA71 is activated in response to the column selection signal C20, and amplifies the data in the memory cell read onto the I/O line pair IO70, IO71, respectively. The sense amplifier & write driver SA70, SA71 is activated in response to the column selection signal C20, and writes the data from the I/O buffer IB70, IB71 to the memory cell through the I/O line pair IO70, IO71 and the bit line pair BL00 to BL03, BL04 to BL07, respectively.

The sense amplifier & write driver SA72, SA73 is activated in response to the column selection signal C21, and amplifies the data in the memory cell read onto the I/O line pair IO72, IO73, respectively. The sense amplifier & write driver SA72, SA73 is activated in response to the column selection signal C21, and writes the data from the I/O buffer IB70, IB71 to the memory cell through the I/O line pair IO72, IO73 and the bit line pair BL10 to BL13, BL14 to BL17, respectively.

The I/O buffer IB70, IB71 externally outputs the data transferred from the I/O line pairs (IO70, IO72), (IO71, IO73) onto the I/O line pair IO170, IO171, and transfers the external data to the I/O line pair IO170, IO171, respectively.

The SRAM structured as described above can also achieve the same effects as those in the first embodiment.

Seventh Embodiment

Figure 9:
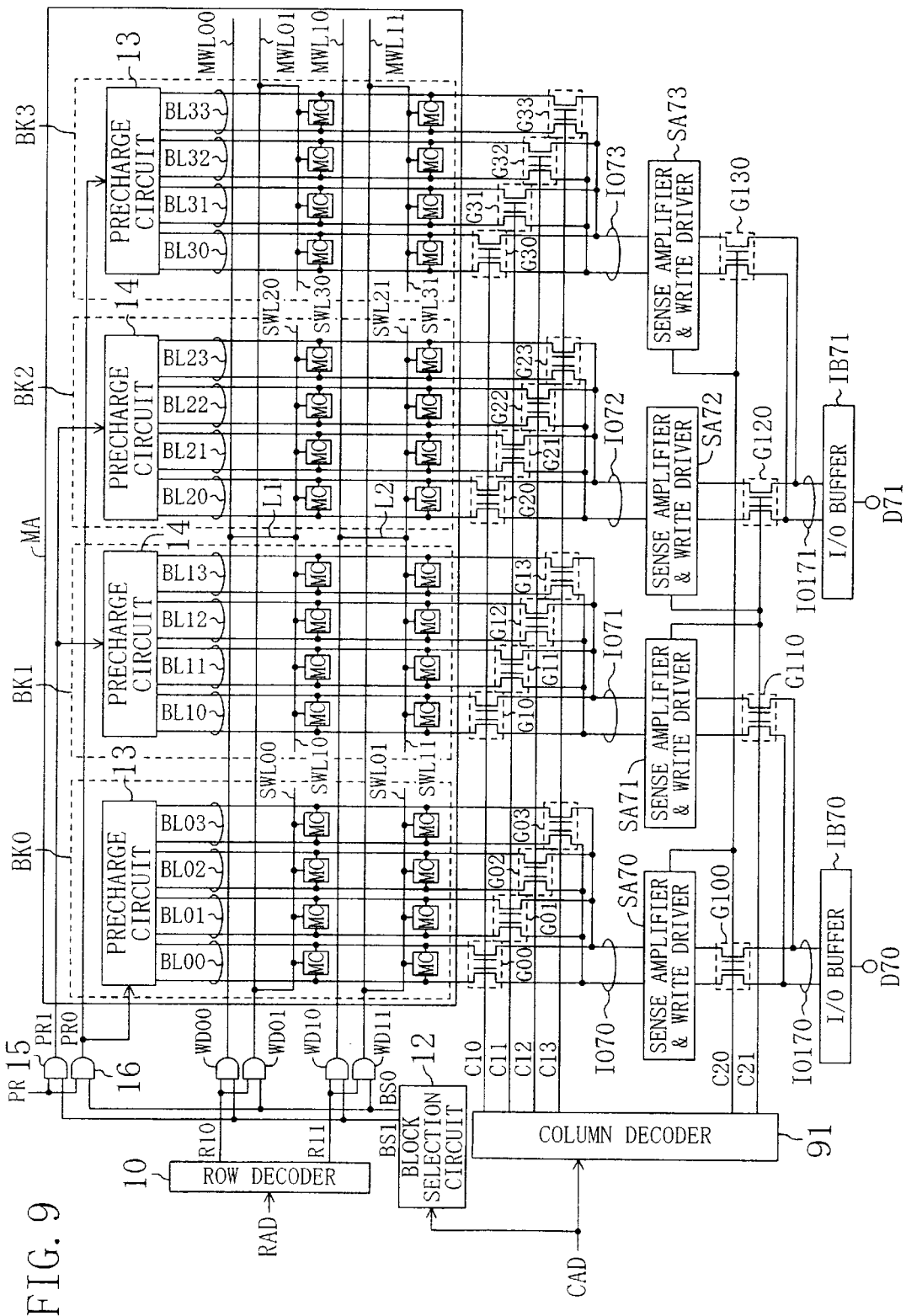

FIG. 9 is a block diagram showing the structure of the SRAM according to the seventh embodiment of the present invention. The SRAM of FIG. 9 is different from that of FIG. 8 in that the memory cell array MA includes four memory blocks BK0 to BK3. The memory cell array MA has the same structure as that shown in FIG. 6.

The column decoder 91 selects one bit line pair from each of the memory blocks BK0 to BK3 in response to a column address signal CAD. In other words, the column decoder 91 selects four bit line pairs in total. The column decoder 91 outputs an active column selection signal C10 to C13 in order to select four bit line pairs (BL00, BL10, BL20, BL30), (BL01, BL11, BL21, BL31), (BL02, BL12, BL22, BL32), (BL03, BL13, BL23, BL33). In response to the column address signal CAD, the column decoder 91 selects two of the I/O line pairs IO70 to IO73 that are respectively connected to the bit line pairs in the memory blocks selected by the block selection circuit 12. The column decoder 91 outputs an active column selection signal C20 in order to select the I/O line pairs IO70, IO73, and outputs an active column selection signal C21 in order to select the I/O line pairs IO71, IO72.

The column selection gates G00 to G03, G10 to G13 are respectively connected between the bit line pairs BL00 to BL03, BL10 to BL13 and the I/O line pairs IO70, IO71. The column selection gates G00 to G03, G10 to G13 connect/disconnect the bit line pairs BL00 to BL03, BL10 to BL13 to/from the I/O line pairs IO70, IO71 in response to the column selection signals C10 to C13, respectively.

The column selection gates G20 to G23, G30 to G33 are respectively connected between the bit line pairs BL20 to BL23, BL30 to BL33 and the I/O line pairs IO72, IO73. The column selection gates G20 to G23, G30 to G33 connect/disconnect the bit line pairs BL20 to BL23, BL30 to BL33 to/from the I/O line pairs IO72, IO73 in response to the column selection signals C10 to C13, respectively.

The column selection gates G100, G130 are respectively connected between the I/O line pairs IO70, IO73 and the I/O line pairs IO170, IO171. The column selection gates G100, G130 connect/disconnect the I/O line pairs IO70, IO73 to/from the I/O line pairs IO170, IO171 in response to the column selection signal C20. The column selection gates G110, G120 are respectively connected between the I/O line pairs IO71, IO72 and the I/O line pairs IO170, IO171. The column selection gates G110, G120 connect/disconnect the I/O line pairs IO71, IO72 to/from the I/O line pairs IO170, IO171 in response to the column selection signal C21, respectively.

Note that the column selection gates G00 to G03, G10 to G13, G20 to G23, G30 to G33 form a first column selection circuit. The column selection gates G100, G110, G120, G130 form a second column selection circuit. The I/O line pairs IO70 to IO73 each forms a first I/O line pair. The I/O line pairs IO170, IO171 each forms a second I/O line pair.

The sense amplifier & write driver SA70, SA73 is activated in response to the column selection signal C20, and amplifies the data in the memory cell read onto the I/O line pair IO70, IO73, respectively. The sense amplifier & write driver SA70, SA73 is activated in response to the column selection signal C20, and writes the data from the I/O buffer IB70, IB71 to the memory cell through the I/O line pair IO70, IO73 and the bit line pair BL00 to BL03, BL30 to BL33, respectively The sense amplifier & write driver SA71, SA72 is activated in response to the column selection signal C21, and amplifies the data in the memory cell read onto the I/O line pair IO71, IO72, respectively. The sense amplifier & write driver SA71, SA72 is activated in response to the column selection signal C21, and writes the data from the I/O buffer IB70, IB71 to the memory cell through the I/O line pair IO71, IO72 and the bit line pair BL10 to BL13, BL20 to BL23.

The I/O buffer IB70, IB71 externally outputs the data transferred from the I/O line pair (IO70, IO71), (IO72, IO73) onto the I/O line pair IO170, IO171, and transfers the external data to the I/O line pair IO170, IO171, respectively.

The SRAM structured as described above can also achieve the same effects as those in the first embodiment.

Eighth Embodiment

Figure 10:
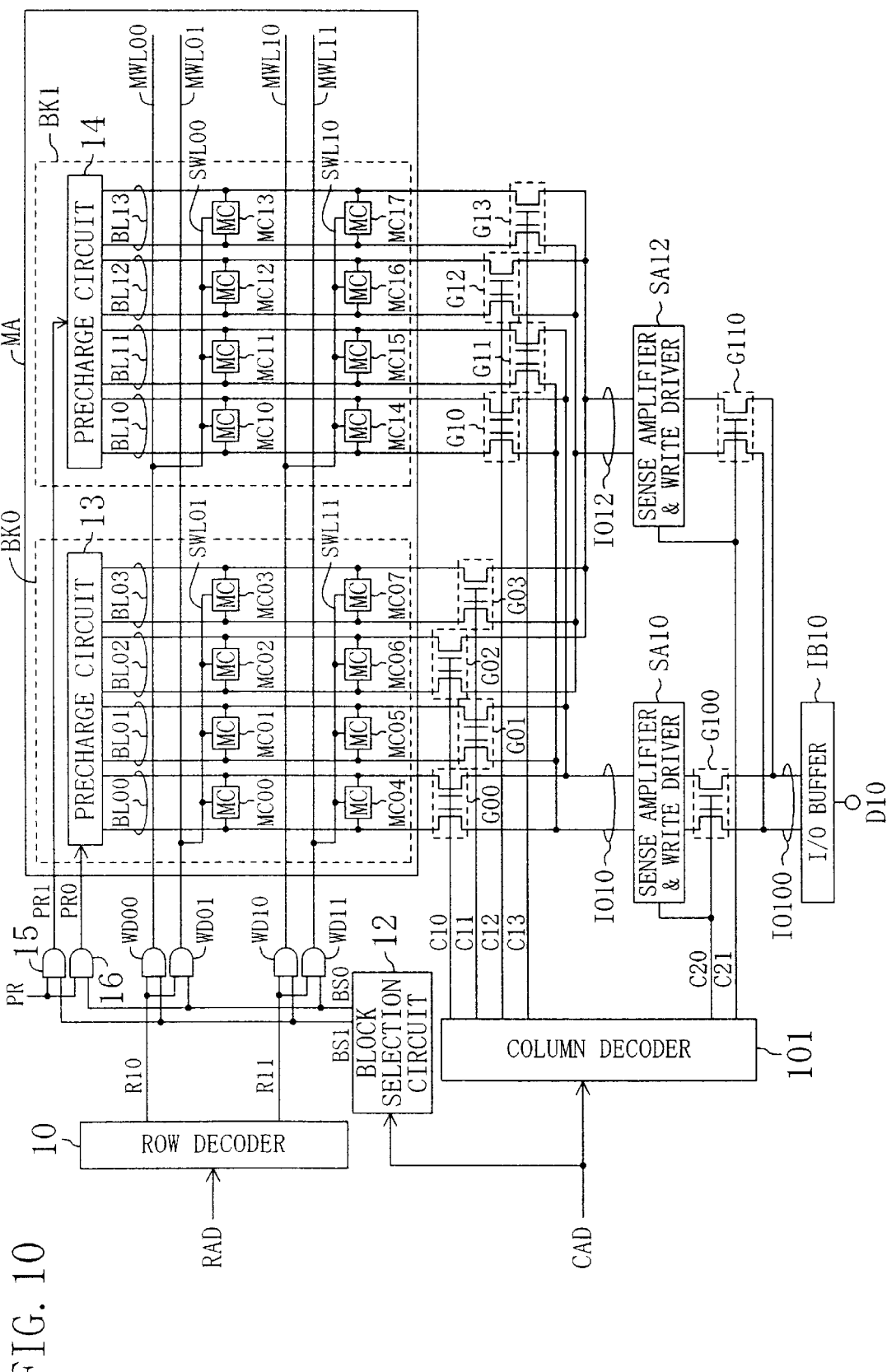

FIG. 10 is a block diagram showing the structure of the SRAM according to the eighth embodiment of the present invention. This SRAM is different from that of FIG. 1 in that this SRAM includes two first I/O line pairs IO10, IO12 and a single second I/O line pair IO100. Referring to FIG. 10, this SRAM includes a column decoder 101, I/O line pairs IO10, IO12, IO100, sense amplifiers & write drivers SA10, SA12, column selection gates G100, G110, and an I/O buffer IB10 instead of the column decoder 11, the I/O line pairs IO0 to IO3, the sense amplifiers & write drivers SA0 to SA3 and the I/O buffers IB0 to IB3 in the SRAM of FIG. 1. This SRAM has otherwise the same structure as that of the SRAM in FIG. 1.

In response to a column address signal CAD, the column decoder 101 selects two bit line pairs from the memory block BK0, BK1 selected by the block selection signal 12. The column decoder 101 outputs an active column selection signal C10 to C13 in order to select the bit line pairs (BL00, BL02), (BL01, BL03), (BL10, BL12), (BL11, BL13). In response to the column address signal CAD, the column decoder 101 selects one of the I/O line pairs IO10 to IO12 that is connected to the bit line pair in the memory block BK0, BK1 selected by the block selection circuit 12. The column decoder 101 outputs an active column selection signal C20 in order to select the I/O line pair IO10, and outputs an active column selection signal C21 in order to select the I/O line pair IO12.

The column selection gates G00, G01, G10, G11 are respectively connected between the bit line pairs BL00, BL01, BL10, BL11 and the I/O line pair IO10. The column selection gates G00, G01, G10, G11 connect/disconnect the bit line pairs BL00, BL01, BL10, BL11 to/from the I/O line pair IO01 in response to the column selection signals C10 to C13, respectively.

The column selection gates G02, G03, G12, G13 are respectively connected between the bit line pairs BL02, BL03, BL12, BL13 and the I/O line pair IO12. The column selection gates G02, G03, G12, G13 connect/disconnect the bit line pairs BL02, BL03, BL12, BL13 to/from the I/O line pair IO12 in response to the column selection signals C10 to C13, respectively.

The column selection gate G100 is connected between the I/O line pairs IO10 and IO100. The column selection gate G100 connects/disconnects the I/O line pair IO10 to/from the I/O line pair IO100 in response to the column selection signal C20. The column selection gate G110 is connected between the I/O line pairs IO12 and IO100. The column selection gate G110 connects/disconnects the I/O line pairs IO12 to/from the I/O line pair IO100 in response to the column selection signal C21.

Note that the column selection gates G00 to G03, G10 to G13 form a first column selection circuit. The column selection gates G100, G110 form a second column selection circuit. The I/O line pairs IO10, IO12 each forms a first I/O line pair. The I/O line pair IO100 forms a second I/O line pair.

The sense amplifier & write driver SA10, SA12 is activated in response to the column selection signal C20, C21, and amplifies the data in the memory cell read onto the I/O line pair IO10, IO12, respectively. The sense amplifier & write driver SA10, SA12 is activated in response to the column selection signal C20, C21, and writes the data from the I/O buffer IB10 to the memory cell through the I/O line pair IO10, IO12 and the bit line pair (BL00, BL01, BL10, BL11), (BL02, BL03, BL12, BL13), respectively.

The I/O buffer IB10 externally outputs the data transferred from the I/O line pair IO10, IO12 onto the I/O line pair IO100, and transfers the external data onto the I/O line pair IO100.

The SRAM structured as described above can also achieve the same effects as those in the first embodiment.

Ninth Embodiment

Figure 11:
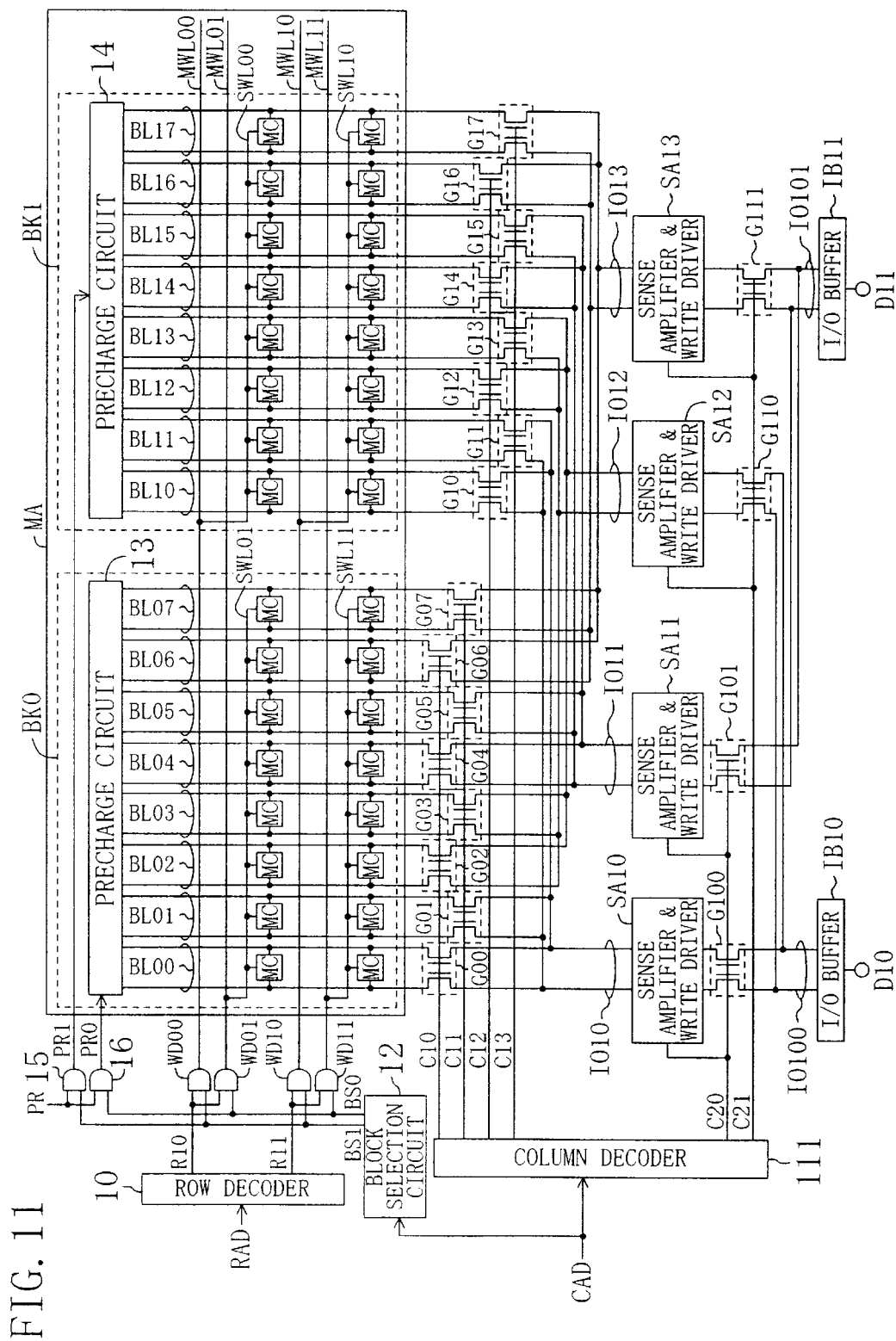

FIG. 11 is a block diagram showing the structure of the SRAM according to the ninth embodiment of the present invention. Referring to FIG. 11, this SRAM further includes I/O line pairs IO11, IO13, IO101, sense amplifiers & write drivers SA11, SA13 and an I/O buffer IB11 in addition to the elements of the SRAM in FIG. 10.

This SRAM selects four bit line pairs from the memory block BK0, BK1 selected by the block selection circuit 12. Two of the selected four bit line pairs are connected to the I/O line pairs IO100, IO101, respectively.

In response to a column address signal CAD, the column decoder 111 selects four bit line pairs from the memory block BK0, BK1 selected by the block selection circuit 12. The column decoder 111 outputs an active column selection signal C10 to C13 in order to select four bit line pairs (BL00, BL02, BL04, BL06), (BL01, BL03, BL05, BL07), (BL10, BL12, BL14, BL16), (BL11, BL13, BL15, BL17). In response to the column address signal CAD, the column decoder 111 selects two of the I/O line pairs IO10 to IO13. The column decoder 111 outputs an active column selection signal C20 in order to select the I/O line pairs IO10, IO11, and outputs an active column selection signal C21 in order to select the I/O line pairs IO12, IO13.

The column selection gates G00, G01, G10, G11 are respectively connected between the bit line pairs BL00, BL01, BL10, BL11 and the I/O line pair IO10. The column selection gates G00, G01, G10, G11 connect/disconnect the bit line pairs BL00, BL01, BL10, BL11 to/from the I/O line pair IO10 in response to the column selection signals C10 to C13, respectively.

The column selection gates G02, G03, G12, G13 are respectively connected between the bit line pairs BL02, BL03, BL12, BL13 and the I/O line pair IO12. The column selection gates G02, G03, G12, G13 connect/disconnect the bit line pairs BL02, BL03, BL12, BL13 to/from the I/O line pair IO12 in response to the column selection signals C10 to C13, respectively.

The column selection gates G04, G05, G14, G15 are respectively connected between the bit line pairs BL04, BL05, BL14, BL15 and the I/O line pair IO11. The column selection gate G04, G05, G14, G15 connect/disconnect the bit line pairs BL04, BL05, BL14, BL15 to/from the I/O line pair IO11 in response to the column selection signals C10 to C13, respectively.

The column selection gates G06, G07, G16, G17 are respectively connected between the bit line pairs BL06, BL07, BL16, BL17 and the I/O line pair IO13. The column selection gates G06, G07, G16, G17 connect/disconnect the bit line pairs BL06, BL07, BL16, BL17 to/from the I/O line pair IO13 in response to the column selection signals C10 to C13, respectively.

The column selection gates G100, G101 are respectively connected between the I/O line pairs IO10, IO11 and the I/O line pairs 10100, IO101. The column selection gates G100, G101 connect/disconnect the I/O line pairs IO10, IO11 to/from the I/O line pairs IO100, IO101 in response to the column selection signal C20, respectively. The column selection gates G110, Gill are respectively connected between the I/O line pairs IO12, IO13 and the I/O line pairs IO100, IO101. The column selection gates G110, G111 connect/disconnect the I/O line pairs IO12, IO13 to/from the I/O line pairs IO100, IO101 in response to the column selection signal C21, respectively.

Note that the column selection gates G00 to G07, G10 to G17 form a first column selection circuit. The column selection gates G100, G101, G110, G111 form a second column selection circuit. The I/O line pairs IO10 to IO13 each forms a first I/O line pair. The I/O line pairs IO100, IO101 each forms a second I/O line pair.

The sense amplifier & write driver SA10, SA12 is activated in response to the column selection signal C20, C21, and amplifies the data in the memory cell read onto the I/O line pair IO10, 1012, respectively. The sense amplifier & write driver SA11, SA12 is activated in response to the column selection signal C20, C21, and writes the data from the I/O buffer IB10 to the memory cell through the I/O line pair IO10, IO12 and the bit line pair (BL00, BL01, BL10, BL11), (BL02, BL03, BL12, BL13), respectively.

The sense amplifier & write driver SA11, SA13 is activated in response to the column selection signal C20, C21, and amplifies the data in the memory cell read onto the I/O line pair IO11, IO13, respectively. The sense amplifier & write driver SA11, SA13 is activated in response to the column selection signal C20, C21, and writes the data from the I/O buffer IB11 to the memory cell through the I/O line pair IO11, IO13 and the bit line pair (BL04, BL05, BL14, BL15), (BL06, BL07, BL16, BL17).

The I/O buffer IB10 externally outputs the data transferred from the I/O line pair IO10, IO12 onto the I/O line pair 10100, and transfers the external data onto the I/O line pair 10100. The I/O buffer IB11 externally outputs the data transferred from the I/O line pair IO11, IO13 onto the I/O line pair IO101, and transfers the external data onto the I/O line pair IO101.

The SRAM structured as described above can also achieve the same effects as those in the first embodiment.

Tenth Embodiment

Figure 12:
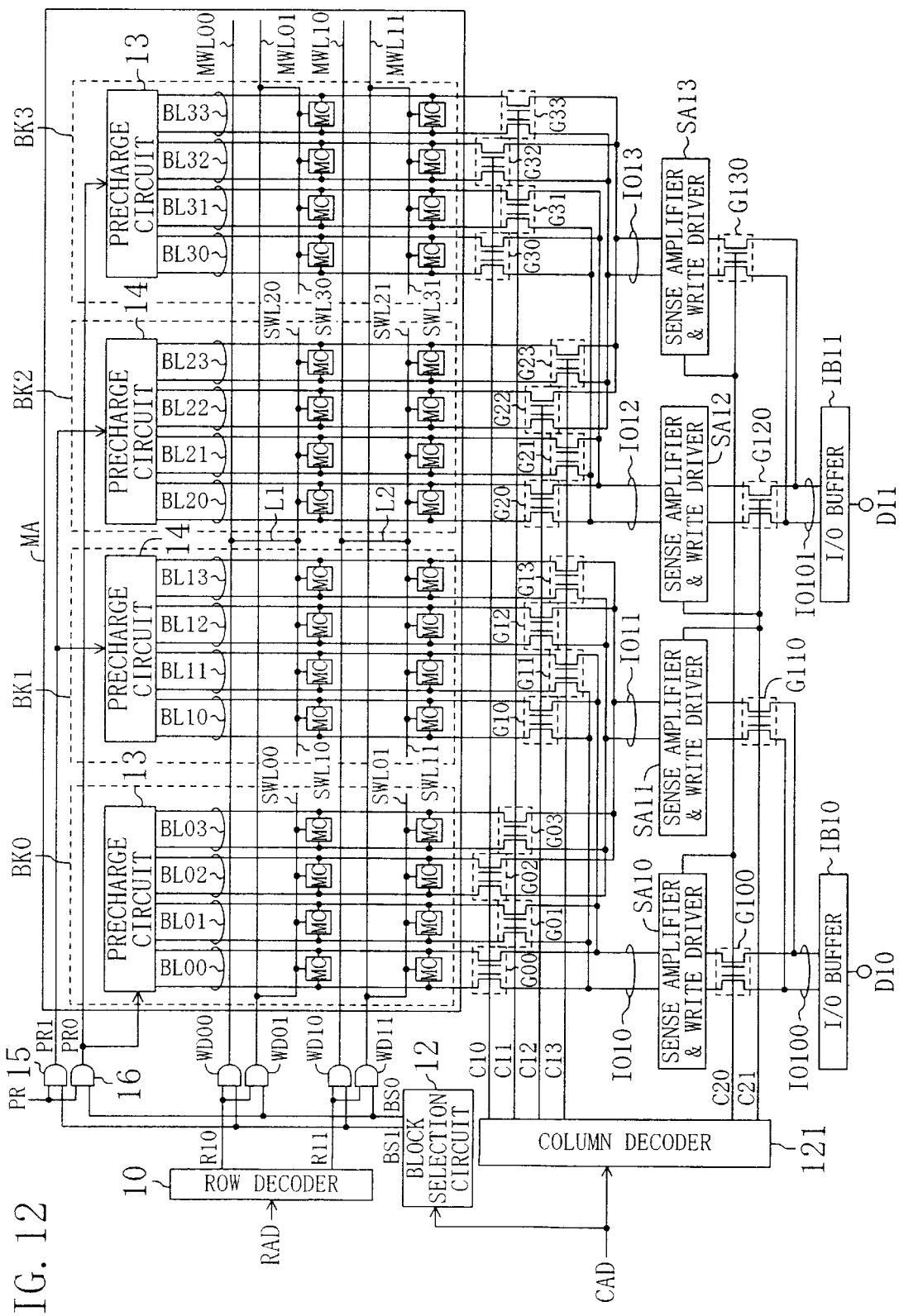

FIG. 12 is a block diagram showing the structure of the SRAM according to the tenth embodiment of the present invention. The SRAM of FIG. 12 is different from that of FIG. 11 in that the memory cell array MA includes four memory blocks BK0 to BK3. The memory cell array MA has the same structure as that shown in FIG. 6.

In response to a column address signal CAD, the column decoder 121 selects two bit line pairs from each of the two memory blocks selected by the block selection circuit 12. In other words, the column decoder 121 selects four bit line pairs in total. The column decoder 121 outputs an active column selection signal C10 to C13 in order to select four bit line pairs (BL00, BL02, BL30, BL32), (BL01, BL03, BL31, BL33), (BL10, BL12, BL20, BL22), (BL11, BL13, BL21, BL23). In response to the column address signal CAD, the column decoder 121 selects two of the I/O line pairs IO10 to IO13, which are respectively connected to the bit line pairs in the memory blocks selected by the block selection circuit 12. The column decoder 121 outputs an active column selection signal C20 in order to select the I/O line pairs IO10, IO13, and outputs an active column selection signal C21 in order to select the I/O line pairs IO11, IO12.

The column selection gates G00, G01, G10, G11 are respectively connected between the bit line pairs BL00, BL01, BL10, BL11 and the I/O line pair IO10. The column selection gates G00, G01, G10, G11 connect/disconnect the bit line pairs BL00, BL01, BL10, BL11 to/from the I/O line pair IO10 in response to the column selection signals C10 to C13, respectively.

The column selection gates G02, G03, G12, G13 are respectively connected between the bit line pairs BL02, BL03, BL12, BL13 and the I/O line pair IO11. The column selection gates G02, G03, G12, G13 connect/disconnect the bit line pairs BL02, BL03, BL12, BL13 to/from the I/O line pair IO11 in response to the column selection signals C10 to C13, respectively.

The column selection gates G30, G31, G20, G21 are respectively connected between the bit line pairs BL30, BL31, BL20, BL21 and the I/O line pair IO12. The column selection gates G30, G31, G20, G21 connect/disconnect the bit line pairs BL30, BL31, BL20, BL21 to/from the I/O line pair IO12 in response to the column selection signals C10 to C13, respectively.

The column selection gates G32, G33, G22, G23 are respectively connected between the bit line pairs BL32, BL33, BL22, BL23 and the I/O line pair IO13. The column selection gates G32, G33, G22, G23 connect/disconnect the bit line pairs BL32, BL33, BL22, BL23 to/from the I/O line pair IO13 in response to the column selection signals C10 to C13.

The column selection gates G100, G130 are respectively connected between the I/O line pairs IO10, IO13 and the I/O line pairs IO100, IO101. The column selection gates G100, G130 connect/disconnect the I/O line pairs IO10, IO13 to/from the I/O line pairs IO100, IO101 in response to the column selection signal C20, respectively. The column selection gates G110, G120 are respectively connected between the I/O line pairs IO11, IO12 and the I/O line pairs IO100, IO101. The column selection gates G110, G120 connect/disconnect the I/O line pairs IO11, IO12 to/from the I/O line pairs IO100, IO101 in response to the column selection signal C21.

Note that the column selection gates G00 to G03, G10 to G13, G20 to G23, G30 to G33 form a first column selection circuit. The column selection gates G100, G110, G120, G130 form a second column selection circuit. The I/O line pairs IO10 to IO13 each forms a first I/O line pair. The I/O line pairs IO100, IO101 each forms a second I/O line pair.

The sense amplifier & write driver SA10, SA11 is activated in response to the column selection signal C20, C21, and amplifies the data in the memory cell read onto the I/O line pair IO10, IO11, respectively. The sense amplifier & write driver SA10, SA11 is activated in response to the column selection signal C20, C21, and writes the data from the I/O buffer IB10 to the memory cell through the I/O line pair IO10, IO11 and the bit line pair (BL00, BL01, BL10, BL11), (BL02, BL03, BL12, BL13), respectively.

The sense amplifier & write driver SA12, SA13 is activated in response to the column selection signal C20, C21, and amplifies the data in the memory cell read onto the I/O line pair IO12, IO13, respectively. The sense amplifier & write driver SA12, SA13 is activated in response to the column selection signal C20, C21, and writes the data from the I/O buffer IB11 to the memory cell through the I/O line pair IO12, IO13 and the bit line pair (BL20, BL21, BL30, BL31), (BL22, BL23, BL32, BL33), respectively.

The I/O buffer IB10 externally outputs the data transferred from the I/O line pair IO10, IO11 onto the I/O line pair IO100, and transfers the external data onto the I/O line pair IO100. The I/O buffer IB11 externally outputs the data transferred from the I/O line pair IO12, IO13 onto the I/O line pair IO101, and transfers the external data onto the I/O line pair IO101.

The SRAM structured as described above can also achieve the same effects as those in the first embodiment.

Although the present invention has been described and illustrated in detail, it is clearly understood that the same is by way of illustration and example only and is not to be taken by way of illustration, the sprit and scope of the present invention being limited only by the terms of the appended claims.

What is claimed is:

1. A semiconductor memory device, comprising:
    a memory cell array including a plurality of memory cells arranged in rows and columns, a plurality of main word lines arranged in the rows, and a plurality of bit line pairs arranged in the columns, wherein
        m main word lines are arranged per row (where m is an integer equal to or greater than two), and
        the memory cell array is divided into a plurality of memory blocks in the column direction, each of the plurality of memory blocks including a plurality of sub word lines arranged in the rows and each connected to one of the m main word lines arranged in the corresponding row, the semiconductor memory device further comprising:
        a block selection circuit for selecting a corresponding one of the plurality of memory blocks in response to a column address signal;
        a row decoder for selecting a corresponding row in response to a row address signal;
        a word driver for activating one of the m main word lines, arranged in the row selected by the row decoder, which is connected to the sub word line included in the memory block selected by the block selection circuit; and
        a column decoder for selecting a corresponding column in response to the column address signal.

2. The semiconductor memory device according to claim 1, further comprising:
    n first input/output (I/O) line pairs (where n is a positive integer), wherein
        the column decoder selects n columns from the memory block selected by the block selection circuit, in response to the column address signal, the semiconductor memory device further comprising:
        a first column selection circuit for connecting bit line pairs corresponding to the n columns selected by the column decoder to the n first I/O line pairs.

3. The semiconductor memory device according to claim 2, wherein the column decoder further selects p first I/O line pairs from the n first I/O line pairs in response to the column address signal (where p is a positive integer), the semiconductor memory device further comprising:
    p second I/O line pairs; and
    a second column selection circuit for connecting the p first I/O line pairs selected by the column decoder to the p second I/O line pairs.

4. The semiconductor memory device according to claim 1, further comprising:
    n first I/O line pairs (where n is a positive integer); and
    p second I/O line pairs (where p is a positive integer), wherein
        the column decoder selects n bit line pairs in response to the column address signal, the n bit line pairs including p bit line pairs included in the memory block selected by the block selection circuit, the semiconductor memory device further comprising:
        a first column selection circuit for connecting the n bit line pairs selected by the column decoder to the n first I/O line pairs; and
        a second column selection circuit for connecting to the p second I/O line pairs p first I/O line pairs of the n first I/O line pairs, which are connected to the p bit line pairs included in the memory block selected by the block selection circuit.

5. The semiconductor memory device according to claim 1, wherein each of a plurality of sub word lines included in one of the plurality of memory blocks and each of a plurality of sub word lines included in a memory block adjacent to the memory block are connected to one of the m main word lines arranged in the corresponding row through a common line.

6. The semiconductor memory device according to claim 1, further comprising a precharge circuit for precharging a plurality of bit line pairs included in the memory block selected by the block selection circuit to a prescribed potential.

* * * * *